United States Patent
Li et al.

(10) Patent No.: US 7,995,383 B2
(45) Date of Patent: Aug. 9, 2011

(54) MAGNETIC TUNNEL JUNCTION CELL ADAPTED TO STORE MULTIPLE DIGITAL VALUES

(75) Inventors: Xia Li, San Diego, CA (US); Seung H. Kang, San Diego, CA (US); Xiaochun Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/973,989

(22) Filed: Dec. 21, 2010

(65) Prior Publication Data

US 2011/0090732 A1      Apr. 21, 2011

Related U.S. Application Data

(63) Continuation of application No. 12/054,536, filed on Mar. 25, 2008, now Pat. No. 7,885,105.

(51) Int. Cl.
*G11C 11/15*      (2006.01)

(52) U.S. Cl. ........ 365/173; 365/130; 365/148; 365/158; 365/225.5; 365/243.5; 977/933; 977/935

(58) Field of Classification Search .................... 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 438/3; 428/810–816, 817–825.1, 428/826; 977/933–935

See application file for complete search history.

(56) References Cited

U.S. PATENT DOCUMENTS

| | | | |
|---|---|---|---|
| 6,072,718 | A | 6/2000 | Abraham et al. |
| 6,621,730 | B1 | 9/2003 | Lage |
| 6,967,864 | B2 | 11/2005 | Kajiyama |
| 7,109,539 | B2 | 9/2006 | Lu |
| 7,221,584 | B2 | 5/2007 | Liu et al. |
| 7,319,262 | B2 | 1/2008 | Liu et al. |
| 7,430,135 | B2 * | 9/2008 | Huai et al. ................ 365/158 |
| 2006/0023492 | A1 | 2/2006 | Min et al. |
| 2006/0033133 | A1 | 2/2006 | Liu et al. |
| 2006/0033136 | A1 | 2/2006 | Liu et al. |
| 2006/0081952 | A1 | 4/2006 | Lin |
| 2007/0030728 | A1 * | 2/2007 | Kent et al. ................ 365/171 |
| 2008/0054536 | A1 | 3/2008 | Lamb |
| 2008/0117552 | A1 | 5/2008 | Zhou et al. |
| 2009/0273972 | A1 * | 11/2009 | Han et al. ................ 365/173 |

OTHER PUBLICATIONS

A Study of Multiple-Valued Magnetoresistive RAM (MRAM) Using Binary MTJ Devices, Graduate School of Information Sciences, Tohoku University, Aoba-Yama 05, Sendai 980-8579, Japan and Department of Electrical and Computer Engineering, University of Toronto.

(Continued)

*Primary Examiner* — Richard Elms
*Assistant Examiner* — Harry W Byrne
(74) *Attorney, Agent, or Firm* — Semion Talpalatsky

(57) ABSTRACT

A particular magnetic tunnel junction (MTJ) cell includes a side wall defining a first magnetic domain adapted to store a first digital value. The MTJ cell also includes a bottom wall coupled to the side wall and defining a second magnetic domain adapted to store a second digital value.

22 Claims, 22 Drawing Sheets

OTHER PUBLICATIONS

Development of the Magnetic Tunnel Junction MRAM at IBM: from first junctions to a 16-Mb MRAM demonstrator chip, 0018-8646106 2006 IBM.

International Search Report-PCT/US2009/036537, International Search Authority-European Patent Office Jul. 2, 2009.

MRAM Fact Sheet, Document Number: MRAMTECHFS, Rev 6, Freescale Semiconductor, Inc. 2007.

Written Opinion-PCT/US2009/036537, International Search Authority-European Patent Office Jul. 2, 2009.

* cited by examiner

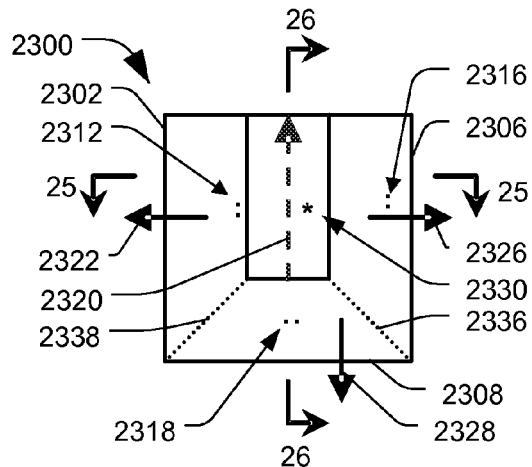
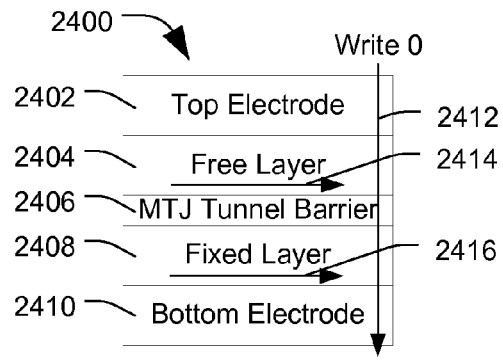
FIG. 23  FIG. 24
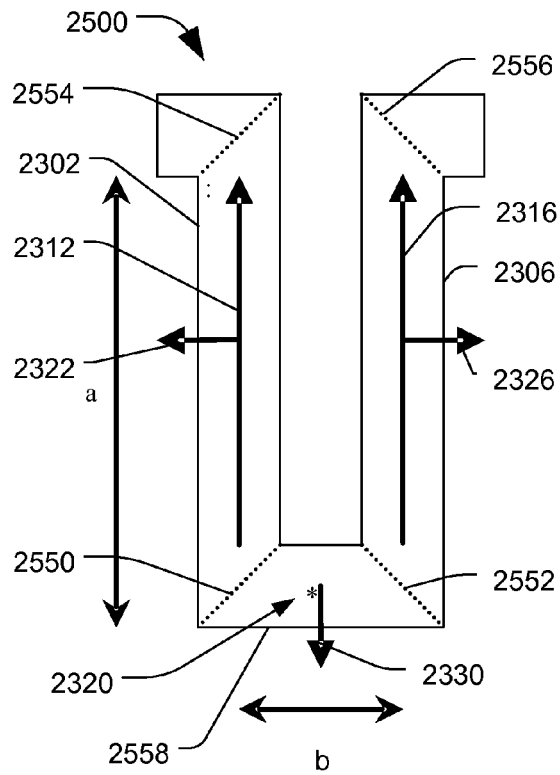
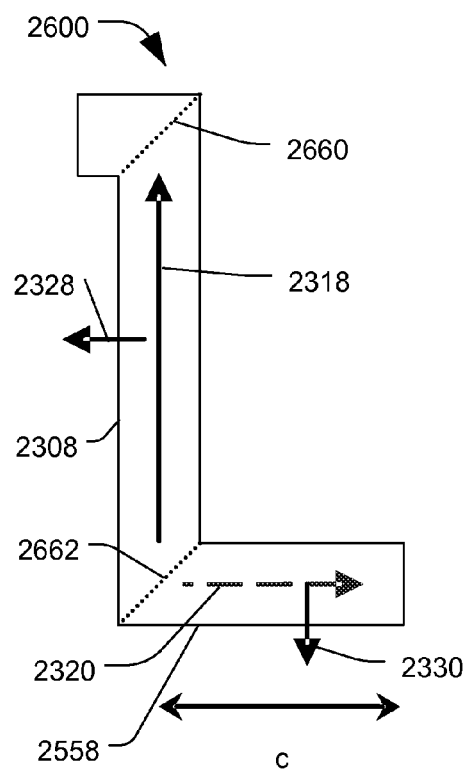
FIG. 25  FIG. 26

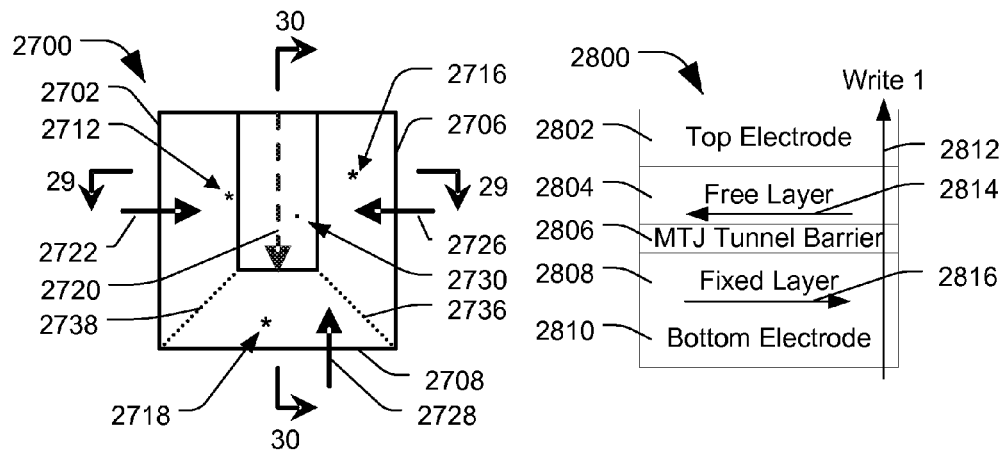
FIG. 27  FIG. 28
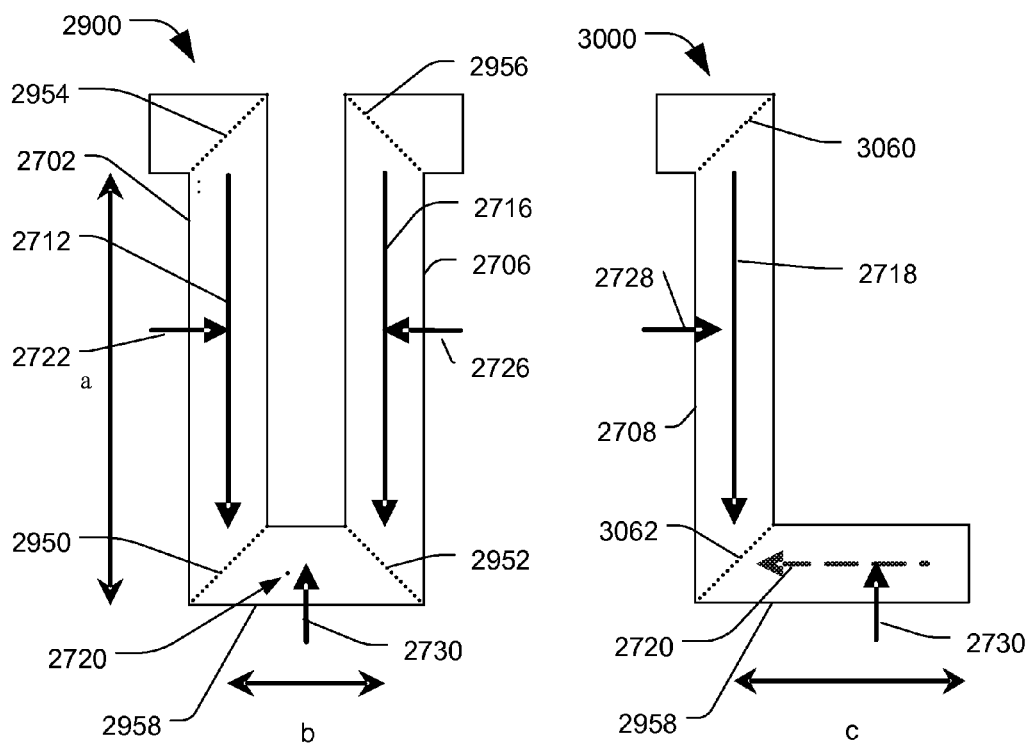
FIG. 29  FIG. 30

MAGNETIC TUNNEL JUNCTION CELL ADAPTED TO STORE MULTIPLE DIGITAL VALUES

I. CLAIM OF PRIORITY

The present application claims priority from and is a continuation of U.S. patent application Ser. No. 12/054,536 filed on Mar. 25, 2008, the contents of which are expressly incorporated herein by reference in their entirety.

II. FIELD

The present disclosure is generally related to a magnetic tunnel junction cell adapted to store multiple digital values.

III. DESCRIPTION OF RELATED ART

In general, widespread adoption of portable computing devices and wireless communication devices has increased demand for high-density and low-power non-volatile memory. As process technologies have improved, it has become possible to fabricate magneto-resistive random access memory (MRAM) based on magnetic tunnel junction (MTJ) devices. Traditional spin torque tunnel (STT) junction devices are typically formed as flat stack structures. Such devices typically have two-dimensional magnetic tunnel junction (MTJ) cells with a single magnetic domain. An MTJ cell typically includes a fixed magnetic layer, a barrier layer (i.e., a tunneling oxide barrier layer, MgO, $Al_2O_3$, etc,), and a free magnetic layer, where a bit value is represented by a magnetic field induced in the free magnetic layer and an anti-ferromagnetic film (AF) layer. Generally, MTJ devices may also include additional layers. A direction of the magnetic field of the free layer relative to a direction of a fixed magnetic field carried by the fixed magnetic layer determines the bit value.

Conventionally, to improve data density using MTJ devices, one technique includes reducing the size of MTJ devices to put more MTJ devices in a smaller area. However, the size of the MTJ devices is limited by the critical dimension (CD) of fabrication technology. Another technique involves forming multiple MTJ structures in a single MTJ device. For example, in one instance, a first MTJ structure is formed that includes a first fixed layer, a first tunnel barrier, and a first free layer. A dielectric material layer is formed on the first MTJ structure, and a second MTJ structure is formed on top of the dielectric material layer. Such structures increase the density of storage in an X-Y direction while increasing a size of the memory array in a Z-direction. Unfortunately, such structures store only one bit per cell, so the data density in the X-Y direction is increased at the expense of area in a Z-direction and may double a MTJ manufacturing cost. Further, such structures increase wire-trace routing complexity. Hence, there is a need for improved memory devices with greater storage density without increasing a circuit area of each of the MTJ cells and that can scale with the process technology.

IV. SUMMARY

In an embodiment, a magnetic tunnel junction (MTJ) cell is disclosed. The MTJ cell includes a side wall defining a first magnetic domain adapted to store a first digital value. The MTJ cell also includes a bottom wall coupled to the side wall and defining a second magnetic domain adapted to store a second digital value.

In another embodiment, a memory device is disclosed that includes a magnetic tunnel junction (MTJ) cell. The MTJ cell includes a side wall defining a first magnetic domain adapted to store a first digital value. The MTJ cell also includes a bottom wall coupled to the side wall and defining a second magnetic domain adapted to store a second digital value.

In another embodiment, a method includes selectively activating a bit line coupled to a center electrode of a magnetic tunnel junction (MTJ) structure including a plurality of side walls, where each of the plurality of sidewalls includes a free layer to carry a unique vertical magnetic domain. The method also includes selectively activating one or more bidirectional switches to enable current to flow through the MTJ structure, the one or more bi-directional switches coupled to respective side walls of the plurality of side walls and to a power source.

One particular advantage provided by embodiments of the magnetic tunnel junction (MTJ) device including multiple vertical magnetic domains is provided in that multiple digital values may be stored at a single MTJ cell. For example, a single MTJ cell may be configured to store up to four or more bits. A MTJ having four bits can store up to sixteen logic states in each MTJ cell.

Another particular advantage is provided in that the multiple-bit MTJ cell can scale with process technology, allowing for multiple bits per MTJ cell even as the MTJ cell size decreases.

Still another particular advantage is provided in that the MTJ cell can include multiple independent magnetic domains to store digital values. In a particular embodiment, the MTJ cell can include multiple sidewalls (extending vertically from a planar surface of a substrate), where each of the multiple sidewalls carries a unique vertical magnetic domain to store a data bit. Additionally, the MTJ cell can include a bottom wall including a horizontal magnetic domain to store another data bit. For example, the MTJ cell can include three sidewalls in various orientations, two sidewalls in a face-to-face orientation or in conjunction, or a single sidewall, in various embodiments.

Yet another particular advantage is provided in that vertical magnetic domains enable increased MTJ cell density with reduced device footprint.

Yet another particular advantage is provided in that the MTJ cell can include multiple independent magnetic domains that may be written to or read from without changing data stored at other magnetic domains within the MTJ cell.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

FIG. 23 is a top view of a second illustrative embodiment of a magnetic tunnel junction (MTJ) stack with multiple vertical magnetic domains where the MTJ cell is written in a bit zero state;

FIG. 24 is a diagram of a second illustrative embodiment of layers of a magnetic tunnel junction (MTJ) stack illustrating a write zero current flow direction;

FIG. 25 is a cross-sectional view of the MTJ stack of FIG. 23 taken along line 25-25 in FIG. 23;

FIG. 26 is a cross-sectional view of the MTJ stack of FIG. 23 taken along line 26-26 in FIG. 23;

FIG. 27 is a top view of a second illustrative embodiment of a magnetic tunnel junction (MTJ) stack with multiple vertical magnetic domains where the MTJ stack is written in a bit one state;

FIG. 28 is a diagram of a second illustrative embodiment of layers of a magnetic tunnel junction (MTJ) structure illustrating a write one current flow direction;

FIG. 29 is a cross-sectional view of the MTJ stack of FIG. 27 taken along line 29-29 in FIG. 27;

FIG. 30 is a cross-sectional view of the MTJ stack of FIG. 27 taken along line 30-30 in FIG. 27;

VI. DETAILED DESCRIPTION

Figure 1:
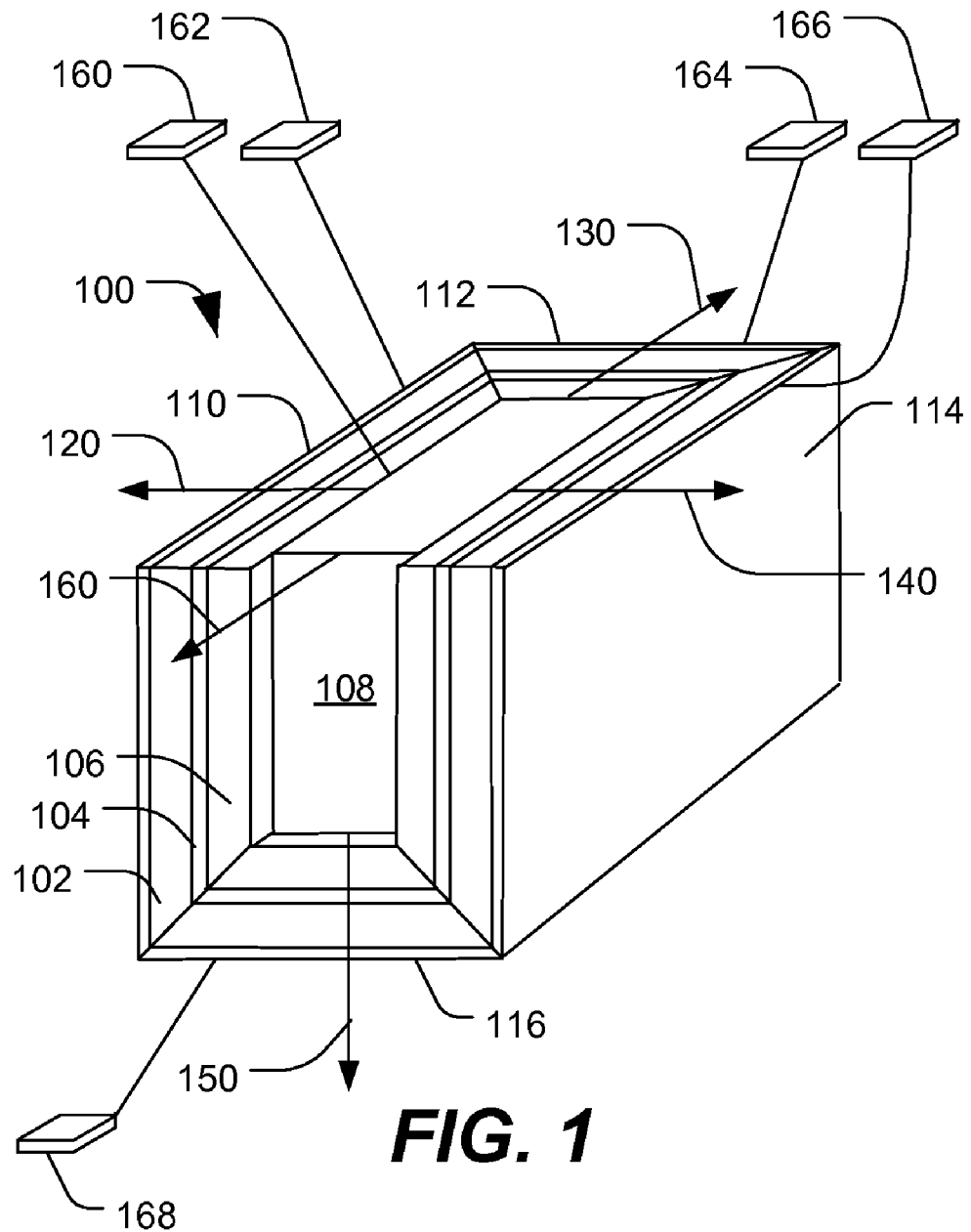
FIG. 1 is a perspective view of a particular illustrative embodiment of a magnetic tunnel junction (MTJ) cell including multiple vertical magnetic domains that can be used to store multiple digital bits.

FIG. 1 is a perspective view of a particular illustrative embodiment of a magnetic tunnel junction (MTJ) cell 100 including multiple vertical magnetic domains that can be used to store multiple digital values. The MTJ cell 100 includes a magnetic tunnel junction (MTJ) stack having a fixed magnetic layer 102, a tunnel junction layer 104, and a free magnetic layer 106 arranged in a substantially rectangular shape. An electrode layer having a first sidewall portion 110, a second sidewall portion 112, a third sidewall portion 114 and a bottom wall portion 116 is electrically and physically coupled to the fixed magnetic layer 102. A center electrode 108 is electrically and physically coupled to the free layer 106. A first terminal structure 160 is coupled to the center electrode 108. A second terminal structure 162 is coupled to the first sidewall 110. A third terminal structure 164 is coupled to the second sidewall 112. A fourth terminal structure 166 is coupled to the third sidewall 114. A fifth terminal structure 168 is coupled to the bottom wall 116. The MTJ cell 100 may also include one or more additional layers (not shown) between top and bottom electrode. For example, the MTJ cell 100 may include an anti-ferromagnetic (AFM) layer (not shown) to pin a magnetic field direction of the fixed layer 102. As another example, the MTJ cell 100 may also include one or more synthetic fixed layers or synthetic free layers (not shown) to enhance MTJ cell performance, or additional anti-ferromagnetic (AFM) layers (not shown) to pin dual spin filter layer for dual spin filter MTJ operation. In addition, in a particular embodiment, an order of the layers 102-106 may be reversed.

Each of the sidewalls 110, 112, and 114 are substantially rectangular and arranged so that the MTJ cell 100 has a U-shaped configuration when viewed from above. In an alternative embodiment, the MTJ cell 100 may include a fourth sidewall (not shown) coupled to a sixth terminal structure (not shown) and may have a rectangular configuration when viewed from above.

In a particular embodiment, a voltage may be applied to the center electrode 108 and an electrical current may flow from the center electrode 108 through the free layer 106, across the tunnel junction 104, and through the fixed layer 102. The electrical current may flow as indicated by the arrows 120, 130, 140, and 150. In an embodiment where a fourth sidewall (not shown) is included, electrical current may also flow as indicated by the arrow 160.

In a particular illustrative embodiment, the free layer 106 may carry multiple independent magnetic domains, each of which may be independently configured by a write current to orient a direction of a magnetic field within the free layer 106 relative to a fixed magnetic field associated with the fixed layer 102 to represent a data value. In particular, when a direction (orientation) of a magnetic field of the fixed layer 102 and the direction of the magnetic field of the free layer 106 are aligned, a data value of "0" is represented. In contrast, when a direction (orientation) of the magnetic field of the free layer 106 is opposite to the direction of the magnetic field of the fixed layer 102, a data value of "1" is represented.

In a particular embodiment, a magnetic domain represents a physical region of magnetic material that carries a magnetic field having a largely homogenous or isotropic orientation. An interface between two magnetic domains may be called a domain wall. The fixed layer 102 may have multiple fixed magnetic domains and associated domain walls that are "pinned" (i.e., fixed during fabrication by application of an external magnetic field during a magnetic annealing process) by an anti-ferromagnetic (AFM) layer (not shown).

In a particular embodiment, each of the vertical portions of the free layer 106 that is substantially parallel to a sidewall includes a distinct vertical magnetic domain. Each vertical magnetic domain includes an independent magnetic field that oriented in a vertical direction substantially parallel to a side wall or substantially normal to the bottom wall, and having a field direction toward the bottom wall 116 (i.e., downward, in the direction of the arrow 150) or away from the bottom wall 116 (i.e., upward, opposite the direction of the arrow 150). A direction of a magnetic field of a vertical magnetic domain associated with the free layer 106 that is adjacent to the sidewall 110 may represent a first data value. A direction of a magnetic field of a vertical magnetic domain associated with the free layer 106 that is adjacent to the sidewall 112 may represent a second data value. A direction of a magnetic field of a vertical magnetic domain associated with the free layer 106 that is adjacent to the sidewall 114 may represent a third data value. In addition, a direction of a magnetic field of a horizontal magnetic domain associated with the free layer 106 that is adjacent to the bottom wall 116 may represent a fourth data value.

Figure 2:
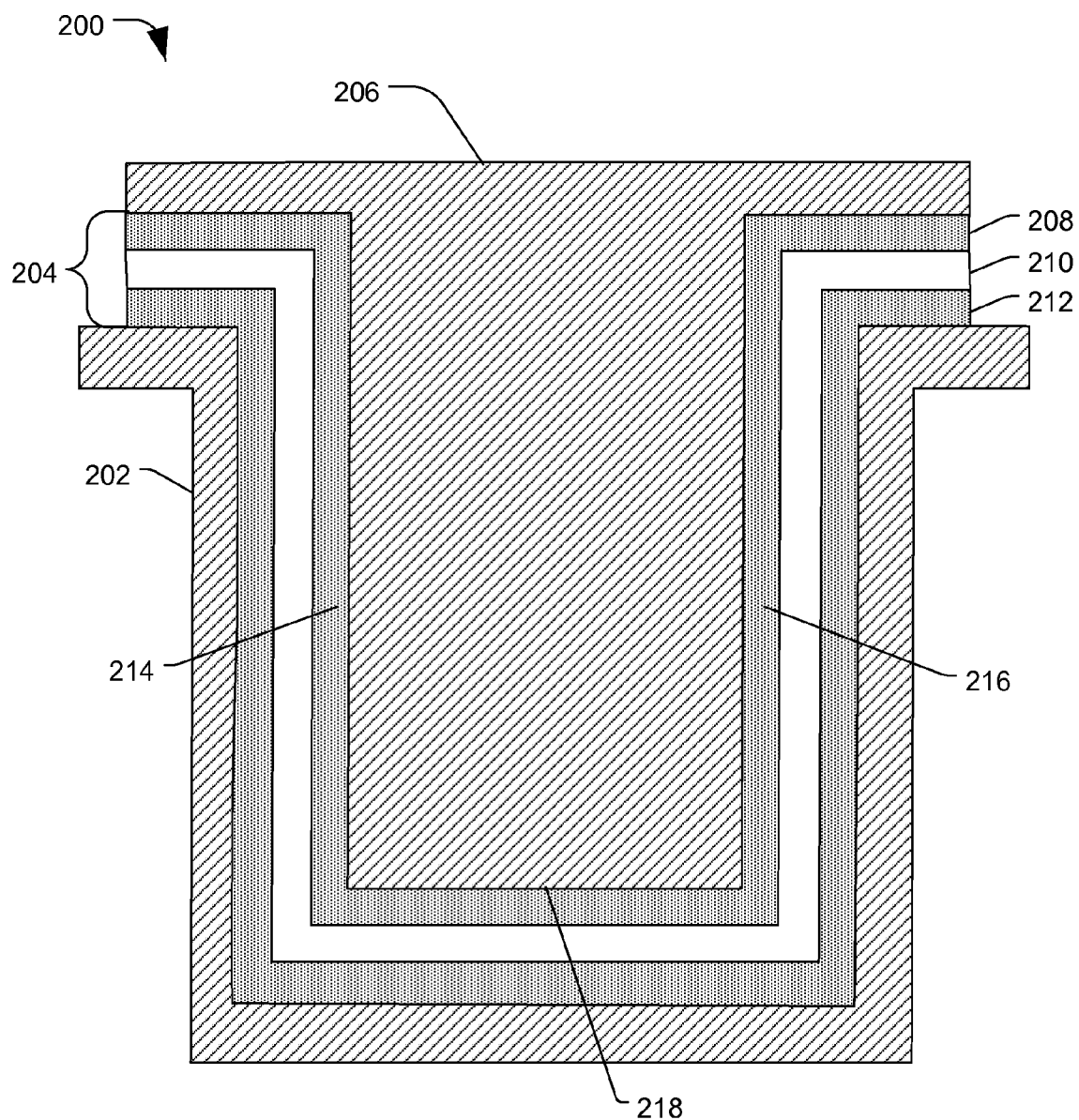
FIG. 2 is a cross-sectional view of a magnetic tunnel junction cell including multiple vertical magnetic domains that is adapted to store multiple digital bits.

FIG. 2 is a cross-sectional view of a magnetic tunnel junction (MTJ) cell 200 including multiple vertical magnetic domains that is adapted to store multiple digital values. The MTJ cell 200 includes a bottom electrode layer 202, a magnetic tunnel junction (MTJ) stack 204, and a top electrode layer 206. The MTJ stack 204 includes a free magnetic layer 208 that carries a magnetic field, which may be programmed by applying a write current between the top electrode 206 and bottom electrode 202. The MTJ stack 204 also includes a tunnel junction barrier layer 210 and a fixed magnetic layer 212.

In a particular embodiment, the fixed layer 212 is generally annealed to be pinned by an anti-ferromagnetic (AFM) layer (not shown) to fix a direction of a magnetic field that is carried by the fixed layer 212. The tunnel barrier 210 may be an oxide barrier layer (e.g., MgO, $Al_2O_3$, etc,) or other diamagnetic layer that is adapted to provide a tunnel junction or barrier between the fixed layer 212 and the free layer 208. The free layer 208 is formed from a ferromagnetic material that carries a programmable (writeable) magnetic domain, which can be altered to store a data value (i.e., a "1" or a "0" data value).

In a particular embodiment, the free layer 208 of the MTJ stack 204 may be adapted to carry multiple independent magnetic domains. For example, the free layer 208 at a first sidewall 214 may include a first vertical magnetic domain associated with a first data value. The free layer 208 at a second sidewall 216 may include a second vertical magnetic domain associated with a second data value. The free layer 208 at a bottom wall 218 may include a horizontal magnetic domain associated with a third data value. The particular orientation of the magnetic field within the free layer at the sidewalls 214 and 216 and at the bottom wall 218 may be controlled, in part, by controlling length, width, and depth dimensions of the MTJ cell 200. In a particular embodiment, a magnetic field in a vertical magnetic domain (e.g., at the free layer 208 along the sidewall 214 or 216) orients in a vertical direction (i.e., downward toward the bottom wall 218 or upward away from the bottom wall 218) along a length of a wall of the MTJ cell 200.

Figure 3:
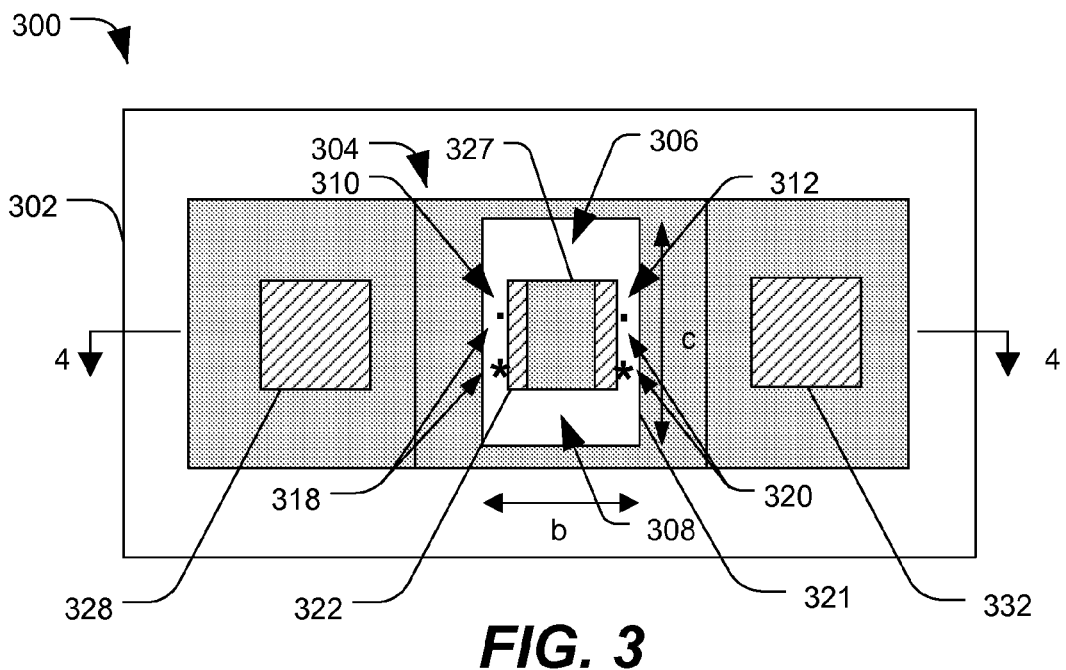
FIG. 3 is a top view of a particular illustrative embodiment of a memory device including a magnetic tunnel junction (MTJ) cell with multiple vertical magnetic domains.

FIG. 3 is a top view of a particular illustrative embodiment of a memory device 300 including a substrate 302 with a magnetic tunnel junction (MTJ) cell 304 with multiple vertical magnetic domains. The MTJ cell 304 includes a first sidewall 306, a second sidewall 308, a third sidewall 310, and a fourth sidewall 312 arranged in a substantially rectangular shape. The device 300 also includes electrical terminals, such as a first terminal 328 and a second terminal 332 to access the MTJ cell 304. The device 300 also includes a third terminal 322 to couple to an electrode 327 of the MTJ cell 304.

Each of the sidewalls 306, 308, 310, and 312 may include a fixed layer, a tunnel barrier, and a free layer, and an anti-ferromagnetic (AFM) layer. In a particular embodiment, each of the sidewalls 306, 308, 310, and 312 may include additional layers. The fixed layer is generally annealed to be pinned by an anti-ferromagnetic layer to fix a direction of a magnetic domain that is carried by the fixed layer. The tunnel barrier may be an oxide barrier layer (i.e., MgO, $Al_2O_3$, etc,) or other diamagnetic layer that is adapted to provide a tunnel junction or barrier between the fixed layer and the free layer. The free layer is formed from a ferromagnetic material that carries a programmable (writeable) magnetic domain, which can be altered to store a data value (i.e., a "1" or a "0" data value). For example, the sidewall 310 carries a first vertical magnetic domain 318. The sidewall 312 carries a second vertical magnetic domain 320. The field direction symbols (.) and (*) indicate possible directions of a magnetic field in the domain (out of the page and into the page, respectively). In a particular embodiment, the first sidewall 306 and the second sidewall 308 also include vertical magnetic domains. The terminal 322 is coupled to the electrode 327, which includes a center component 326 (depicted in FIG. 4) that extends proximate to each of the sidewalls 306, 308, 310, and 312. The center component 326 is spaced approximately equally from a second electrode 321 that is adjacent to each of the sidewalls 306, 308, 310, and 312.

Figure 4:
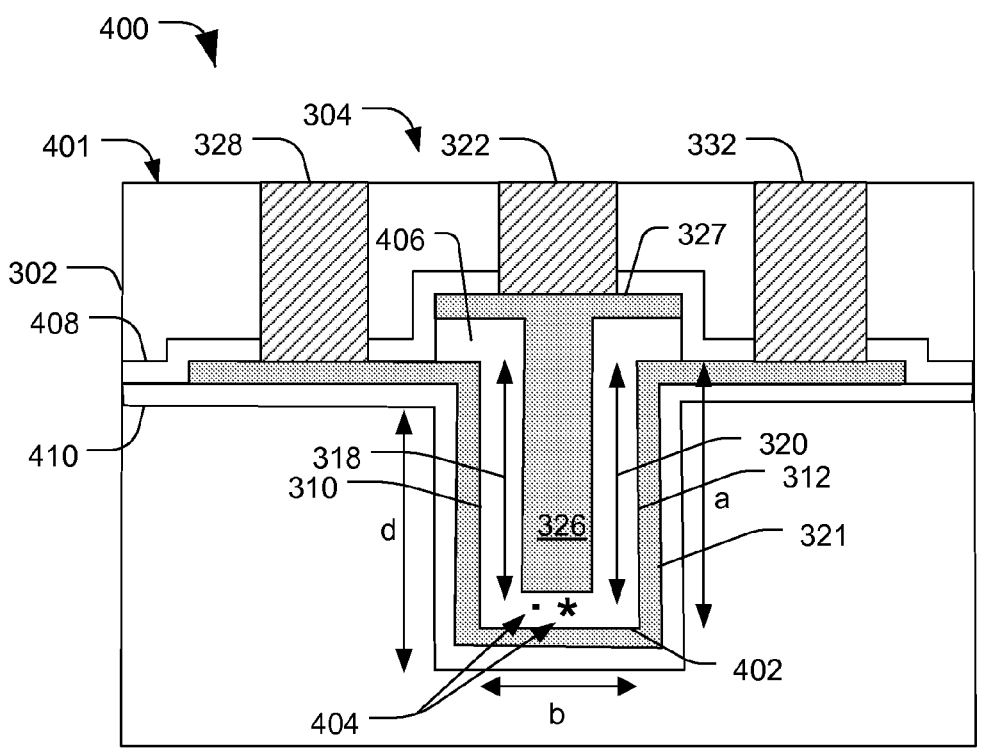
FIG. 4 is a cross-sectional view of the memory device of FIG. 3 taken along line 4-4 in FIG. 3.

FIG. 4 is a cross-sectional view of the memory device of FIG. 3 taken along line 4-4 in FIG. 3. The cross-sectional view 400 shows the substrate 302 including the magnetic tunnel junction (MTJ) cell 304. In this view, the cross-section is taken lengthwise through the MTJ cell 304. The terminal 322 extends from a top surface 401 (i.e., a planar surface) of the substrate 302 to the electrode 327. The terminals 328 and 332 extend from the top surface 401 of the substrate 302 to the second electrode 321. The electrode 327 includes the center component 326 that is proximate to each of the sidewalls 310 and 312 and that is spaced approximately equally from a bottom electrode 321 along each of the sidewalls 310 and 312 and a bottom wall 402. The MTJ cell 304 includes a magnetic tunnel junction (MTJ) stack 406 and capping layers 408 and 410. The MTJ stack 406 includes the sidewalls 310 and 312, which are adapted to carry unique vertical magnetic domains representing stored digital values. The MTJ stack 406 is located in a trench having depth (d).

The electrode 321 extends along the bottom wall 402 of the MTJ cell 304 and also extends along the sidewalls 310 and 312. The MTJ stack 406 carries multiple unique vertical magnetic domains. The sidewall portion 310 of the MTJ stack 406 carries a magnetic domain that includes the magnetic field 318, which extends along a height (a) of the sidewalls 310 and 312 (i.e., along the surface of the page). In general, if a height (a) of a sidewall 310 or 312 is greater than a width (c) of the sidewall, a magnetic field 318 or 320 carried by the sidewall 310 or 312 of the MTJ stack 406 is oriented vertically along the respective sidewall. Hence, in the cross-sectional view 400, the magnetic field 318 extends along the surface of the page in a direction corresponding to the height (a) of the sidewall 310. The direction of the magnetic field 318 is determined by the stored data value. For example, a "1" value may be represented by the magnetic field 318 extending down toward the bottom wall 402, while a "0" value may be represented by the magnetic field 318 extending up toward the electrode 327.

The MTJ stack 406 that is proximate to the bottom wall 402 carries another unique magnetic domain 404, which extends in a longitudinal direction (i.e., along the direction (c) in FIG. 3 and normal to the page in FIG. 4) along the bottom wall 402 of the MTJ cell 304. Since a length (c) of the bottom wall 402 is greater than a width (b) of the bottom wall 402, the magnetic domain 404 is oriented in a direction of the length (c).

In a particular embodiment, the MTJ cell 304 includes a width (b) and (c) that is less than sidewall height (a), which is approximately equal to the depth (d). The bottom wall 402 has a length (c) that is greater than a width (b). Accordingly, the magnetic domain 404 along the bottom wall 402 of the MTJ cell 304 is oriented along the length (c), and the magnetic domains 318 and 320 at the sidewalls 310 and 312 are oriented in a vertical direction along a length of the sidewalls 310 and 312 (i.e., in a direction parallel to the dimension arrow (a) illustrated in FIG. 4).

Figure 5:
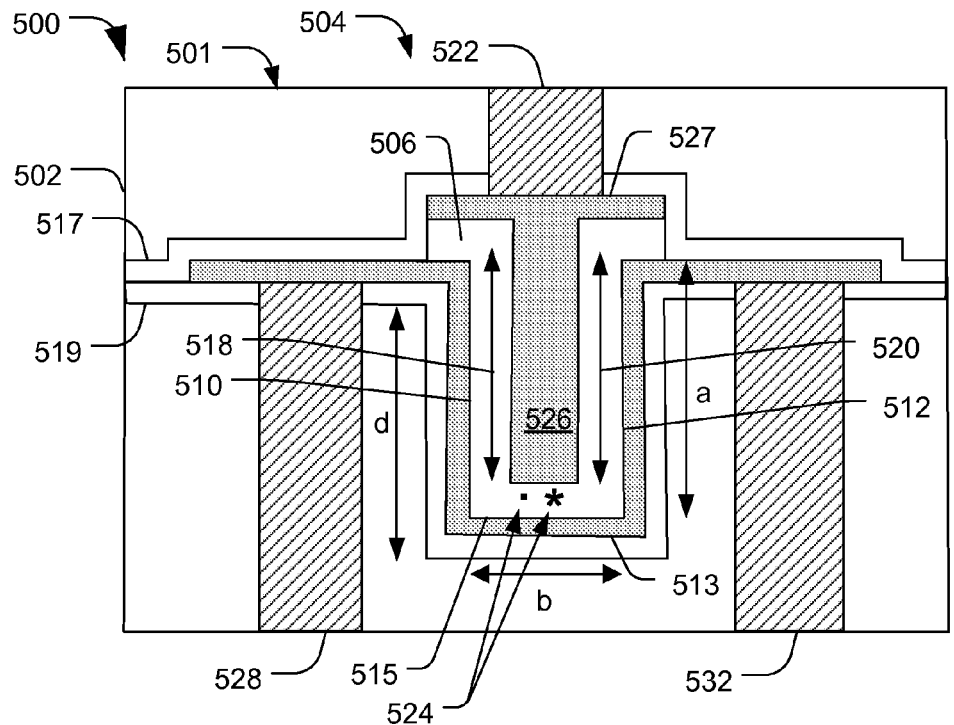
FIG. 5 is a cross-sectional view of a second particular illustrative embodiment of a memory device including a magnetic tunnel junction (MTJ) cell with multiple vertical magnetic domains.

Referring to FIG. 5, a cross-sectional view of a second particular illustrative embodiment of a memory device including a magnetic tunnel junction (MTJ) cell with multiple vertical magnetic domains is depicted and generally designated 500. The view 500 includes a substrate 502 having a MTJ cell 504. Terminals 532 and 528 are coupled to a bottom MTJ cell 504. A terminal 522 extends from a top surface 501 of the substrate 502 and is coupled to an electrode 527 that includes a center component 526. The center component 526 extends proximate to sidewalls 510 and 512 of an MTJ stack 506. The center component 526 is approximately equally spaced apart from the sidewalls 510 and 512 and from a bottom wall 515. The MTJ cell 504 also includes capping layers 517 and 519 and the MTJ stack 506. The MTJ stack 506 includes at least a fixed layer, a tunnel barrier, and a free layer, which carries multiple unique magnetic domains. In a particular embodiment, additional layers (AFM or other layers) may also be included between the top and bottom electrodes 527 and 513.

For example, the MTJ stack 506 carries a first unique vertical magnetic domain at the sidewall 510, which includes the magnetic field 518. The MTJ stack 506 also carries a second unique vertical magnetic domain at the sidewall 512, which includes the magnetic field 520. The MTJ stack 506 also carries a horizontal magnetic domain at the bottom wall 515, which includes the magnetic field 524. The multiple unique vertical magnetic domains are enabled by relative dimensions of the sidewalls, with a sidewall width (such as (b)) less than a sidewall height (a), which is approximately equal to a trench depth (d). Each of the magnetic fields 518, 520, and 524 may be programmed to have one of the two respective directions indicated for the respective field. For example, the vertical fields 518 and 520 may be independently programmed to have a direction indicated by the upper arrowhead or a direction indicated by the bottom arrowhead. Similarly, the horizontal field 524 may be programmed to have a direction into the page (indicated by "*") or out of the page (indicated by ".").

Figure 6:
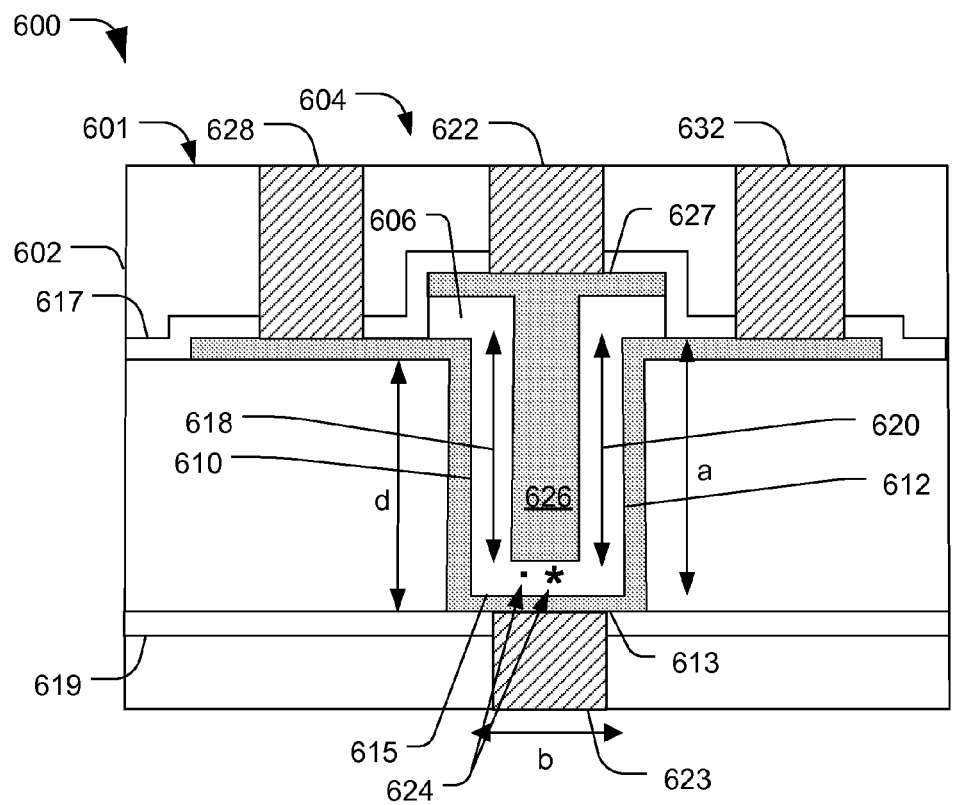
FIG. 6 is a cross-sectional view of a third particular illustrative embodiment of a memory device including a magnetic tunnel junction (MTJ) cell with multiple vertical magnetic domains.

Referring to FIG. 6, a cross-sectional view of a third particular illustrative embodiment of a memory device including a magnetic tunnel junction (MTJ) cell with multiple vertical magnetic domains is depicted and generally designated 600. The view 600 includes a substrate 602 having a MTJ cell 604. Terminals 632 and 628 are coupled to a bottom electrode 613 and extend from a top surface 601. A terminal 623 is coupled to the bottom electrode 613 and extends downward from the bottom electrode 613. A terminal 622 extends from the top surface 601 of the substrate 602 and is coupled to an electrode 627 that includes a center component 626. The center component 626 extends proximate to sidewalls 610 and 612 of an MTJ stack 606. The center component 626 is approximately equally spaced apart from the sidewalls 610 and 612 and from a bottom wall 615. The MTJ cell 604 also includes capping layers 617 and 619 and the MTJ stack 606. The MTJ stack 606 includes a fixed layer, a tunnel barrier, and a free layer, which carries multiple unique magnetic domains. The MTJ stack 606 may also include an anti-ferromagnetic layer, other layers, or any combination thereof.

For example, the MTJ stack 606 carries a first unique vertical magnetic domain at the sidewall 610, which includes the magnetic field 618. The MTJ stack 606 also carries a second unique vertical magnetic domain at the sidewall 612, which includes the magnetic field 620. The MTJ stack also carries a horizontal magnetic domain at the bottom wall 615, which includes the magnetic field 624. The multiple unique vertical magnetic domains are enabled by relative dimensions of the sidewalls, with a sidewall width (such as (b)) less than a sidewall height (a), which is approximately equal to a trench depth (d). Each of the magnetic fields 618, 620, and 624 may be programmed to have one of the two respective directions indicated for the respective field. For example, the vertical fields 618 and 620 may be independently programmed to have a direction indicated by the upper arrowhead or a direction indicated by the bottom arrowhead. Similarly, the horizontal field 624 may be programmed to have a direction into the page (indicated by "*") or out of the page (indicated by ".").

In a particular embodiment, one or more of the terminals 628, 632, and 623 that are coupled to the bottom electrode 613 may be used to determine a value stored via magnetic domains at each of the sidewalls 610 and 612 as well as the bottom wall 615. For example, a current flow from the terminal 622 to the terminal 628 is primarily responsive to a direction of the magnetic field 618 relative to a fixed field associated with the sidewall 610. Likewise, a current flow from the terminal 622 to the terminal 632 is primarily responsive to a direction of the magnetic field 620 relative to a fixed field associated with the sidewall 612. A current flow from the terminal 622 to the terminal 623 is primarily responsive to a direction of the magnetic field 624 relative to a fixed field associated with the bottom wall 615.

Figure 7:
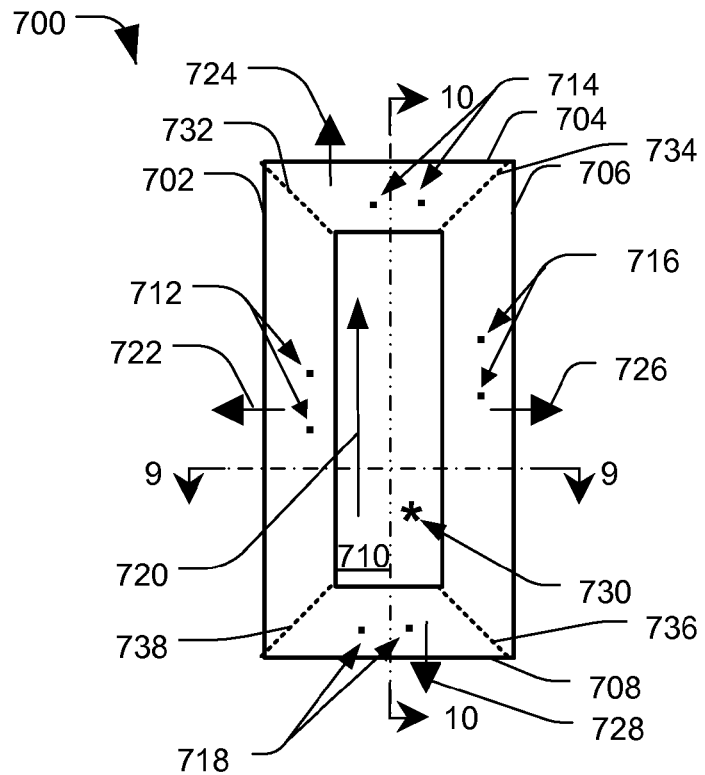
FIG. 7 is a top view of a particular illustrative embodiment of a magnetic tunnel junction (MTJ) stack with multiple vertical magnetic domains where the MTJ cell is written in a bit zero state.

FIG. 7 is a top view of a particular illustrative embodiment of a magnetic tunnel junction (MTJ) stack with multiple vertical magnetic domains where the MTJ cell is written in a bit zero state. In this example, the MTJ stack 700 is illustrated in a bit zero state, where each of the bits represents a zero value. The MTJ stack 700 includes a first sidewall 702, a second sidewall 704, a third sidewall 706, a fourth sidewall 708, and a bottom wall 710. Each of the sidewalls 702, 704, 706, and 708, and the bottom wall 710 include a fixed layer, a tunnel barrier, and a free layer. The free layers of each of the sidewalls 702, 704, 706 and 708 carry unique vertical magnetic domains and the free layer of the bottom wall 710 carries a unique magnetic domain configured to represent a data value, such as a "1" or a "0" value. The first sidewall 702 includes a free layer that carries a vertical first magnetic domain 712. The second sidewall 704 includes a free layer that carries a vertical second magnetic domain 714. The third sidewall 706 includes a free layer that carries a vertical third magnetic domain 716. The fourth sidewall 708 includes a free layer that carries a vertical fourth magnetic domain 718. The bottom wall 710 includes a free layer that carries a horizontal fifth magnetic domain 720.

The first magnetic domain 712 of the first sidewall 702 is separated from the second magnetic domain 714 of the second sidewall 704 by a first domain barrier 732. Similarly, the second magnetic domain 714 of the second sidewall 704 is separated from the third magnetic domain 716 of the third sidewall 706 by a second domain barrier 734. The third magnetic domain 716 of the third sidewall 706 is also separated from the fourth magnetic domain 718 of the fourth sidewall 708 by a third domain barrier 736. The fourth magnetic domain 718 of the fourth sidewall 708 is separated from the first magnetic domain 712 of the first sidewall 702 by a fourth domain barrier 738.

In general, the first domain barrier 732, the second domain barrier 734, the third domain barrier 736 and the fourth domain barrier 738 represent domain walls, which are interfaces that separate magnetic domains, such as the magnetic domains 712, 714, 716, and 718, respectively. Such domain barriers 732, 734, 736, and 738 represent a transition between different magnetic moments. In a particular embodiment, the domain barriers 732, 734, 736, and 738 may represent a change in a magnetic moment where a magnetic field undergoes an angular displacement of 0 or 180 degrees.

The direction of a magnetic field associated with the first magnetic domain 712 (i.e., a direction of a magnetic field within a free layer) in the first sidewall 702 may be altered using a first write current 722. Similarly, a direction of a magnetic field associated with the second magnetic domain 714 carried by a free layer of the sidewall 704 may be altered using a second write current 724. A direction of a magnetic field associated with the third magnetic domain 716 that is carried by a free layer in the third sidewall 706 may be altered using a third write current 726. A direction of a magnetic field associated with the fourth magnetic domain 718 carried by a free layer of the fourth sidewall 708 may be altered using a fourth write current 728. A direction of a magnetic field associated with the fifth magnetic domain 720 carried by a free layer of the bottom wall 710 may be altered using a fifth write current 730.

In general, a relative direction of the magnetic field carried by the free layer relative to a fixed magnetic field in the fixed layer of each of the sidewalls 702, 704, 706, and 708 determines the bit value stored by that particular sidewall. In the example shown, the fixed layer and free layer magnetic directions are in parallel (as illustrated in by magnetic fields 814 and 816 in FIG. 8). Accordingly, the write currents 722, 724, 726, 728, and 730 may represent write "0" currents, placing the MTJ stack 700 in a reset or "0" state.

Figure 8:
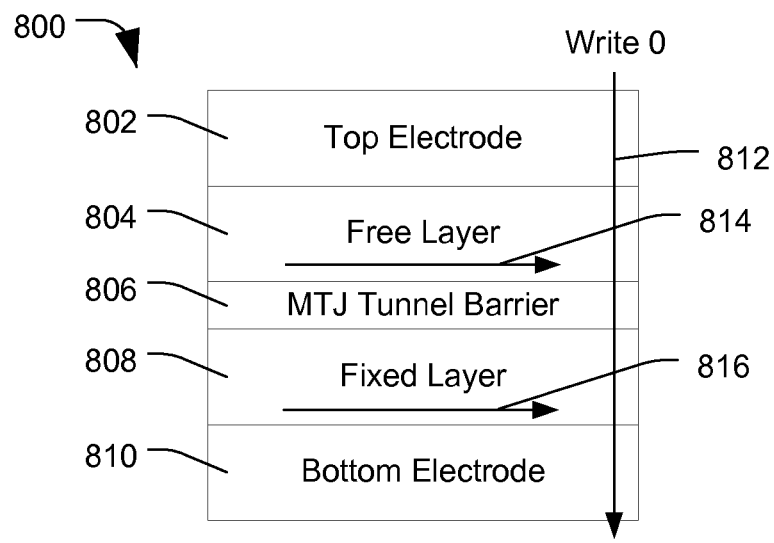
FIG. 8 is a diagram of a particular illustrative embodiment of layers of a magnetic tunnel junction (MTJ) stack illustrating a write zero current flow direction.

FIG. 8 is a diagram of a particular illustrative embodiment of layers of a magnetic tunnel junction (MTJ) stack 800 illustrating a write zero current flow direction. The MTJ structure 800 includes a top electrode 802, a free layer 804, a magnetic tunnel junction tunnel barrier 806, a fixed layer 808, and a bottom electrode 810. An anti-ferromagnetic (AF) layer may be located between the fixed layer 808 and the bottom electrode 810. In general, the top electrode 802 and the bottom electrode 810 are electrically conductive layers adapted to carry an electrical current. The fixed layer 808 is a ferromagnetic layer that has been annealed to be pinned, such as by an AF layer, to fix a direction of a magnetic field 816 within the fixed layer 808. The free layer 804 is a ferromagnetic layer that may be programmed by a write current. The MTJ tunnel barrier or barrier layer 806 may be formed from an oxide barrier layer (i.e., MgO, $Al_2O_3$, etc,) or other diamagnetic material. The direction of a magnetic field 814 within the free layer 804 may be changed using the write current. The MTJ stack 800 may also include a synthesis fixed layer structure, a synthesis free layer (SyF) structure, a dual spin filter (DSF) structure, or any combination thereof.

A direction of the magnetic fields in the free layer 804 relative to the fixed magnetic field of the fixed layer 808 indicates whether the data bit stored at the free layer 804 of the particular MTJ cell 800 is a bit value of "1" or bit value of "0." The magnetic direction of the magnetic field in the free layer 804, generally indicated at 814, may be changed using a write current 812. As shown, the write current represent a write 0 current that flows from the top electrode 802 through the free layer 804, across the magnetic tunnel junction barrier 806, through the fixed layer 808, and through the bottom electrode 810.

Figure 9:
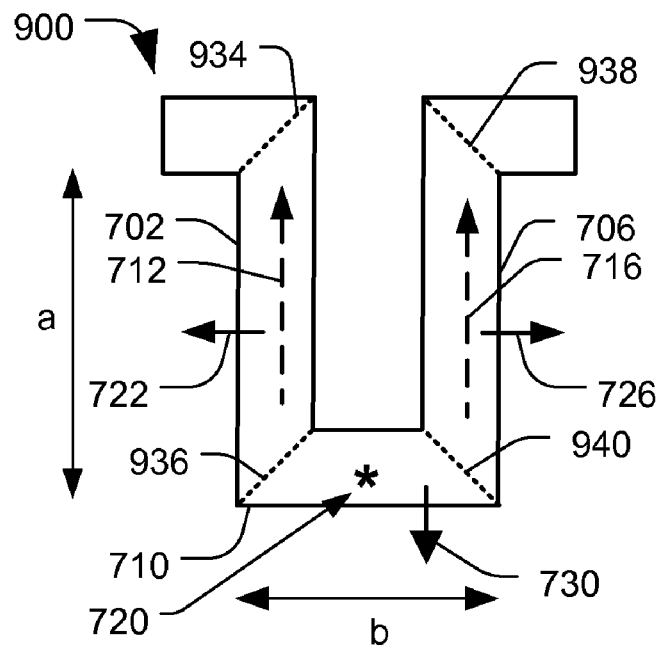
FIG. 9 is a cross-sectional view of the MTJ stack of FIG. 7 taken along line 9-9 in FIG. 7.

FIG. 9 is a cross-sectional view 900 of the MTJ stack of FIG. 7 taken along line 9-9 in FIG. 7. The MTJ stack includes the first sidewall 702, the third sidewall 706 and the bottom wall 710. In this example, a direction of a first magnetic field carried by the free layer in the first sidewall 702, as indicated at 712, extends vertically along the first sidewall 702 and in a direction corresponding to the arrow 712. A direction of a third magnetic field carried by the free layer of the third sidewall 706, as indicated at 716, extends vertically along the third sidewall 706 and in a direction corresponding to the arrow 716.

The MTJ stack includes a first domain barrier (wall) 934 and a second domain barrier 936. In a particular example, the second domain barrier 936 may correspond to a structural interface between the sidewall 702 and the bottom wall 710. The second domain barrier 936 isolates the first magnetic domain 712 of the free layer of the first sidewall 702 from the fifth magnetic domain 720 at the bottom wall 710. The MTJ stack also includes a third domain barrier 938 and a fourth domain barrier 940. The fourth domain barrier 940 may correspond to a structural interface between the bottom wall 710 and the sidewall 706. The fourth domain barrier 940 isolates the magnetic field 716 of a free layer of the sidewall 706 from the magnetic field 720 of the free layer associated with the bottom wall 710.

In the embodiment illustrated in FIG. 9, the MTJ stack may be adapted to store at least three data bits. A first data bit may be represented by the first magnetic field 712 carried by a free layer of the first sidewall 702. A second data bit may be represented by the fifth magnetic field 720 carried by a free layer of the bottom wall 710. A third data bit may be represented by the third magnetic field 716 carried by a free layer of the third sidewall 706. The write currents 722, 726, and 730 may be applied to selectively alter an orientation of the magnetic field of a selected sidewall without altering the orientation of the magnetic field associated with the other sidewall or of the bottom wall 710, for example.

Figure 10:
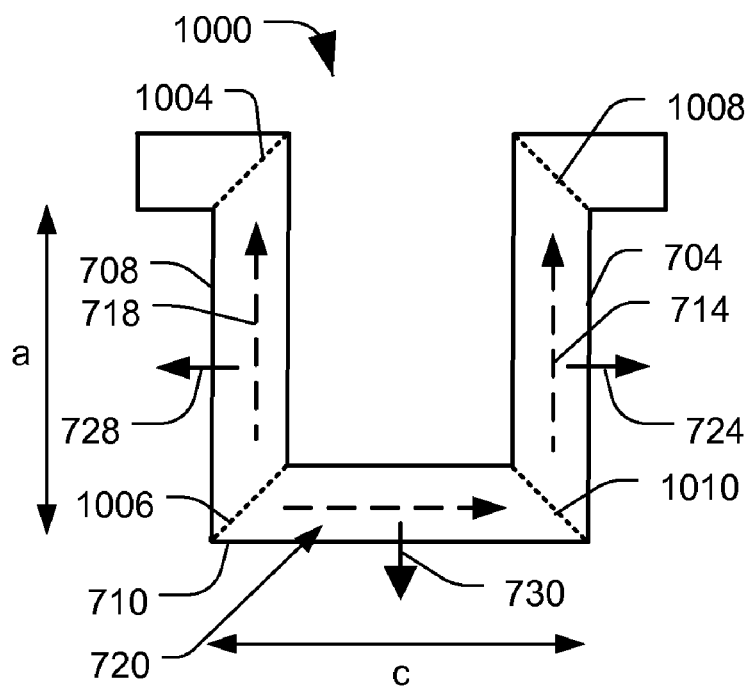
FIG. 10 is a cross-sectional view of the MTJ stack of FIG. 7 taken along line 10-10 in FIG. 7.

FIG. 10 is a cross-sectional view 1000 of the MTJ stack of FIG. 7 taken along line 10-10 in FIG. 7. The MTJ stack illustrates the sidewalls 704 and 708 of the MTJ stack. In this particular example, the MTJ stack includes magnetic domains barriers 1004 and 1006. The magnetic domain barrier (or wall) 1006 isolates the magnetic domain 718 carried by a free layer of the sidewall 708 from the magnetic domain 720 carried by a free layer of the bottom wall 710. Additionally, the MTJ stack includes the magnetic domain barriers 1008 and 1010. The domain barrier 1010 may correspond to a structural interface between the sidewall 704 and the bottom wall 710. The domain barrier 1010 may isolate the magnetic field 714 carried by the free layer of the sidewall 704 from the magnetic field 720 carried by the free layer of the bottom wall 710.

In a particular illustrative embodiment, the domain barriers 732, 734, 736 and 738 illustrated in FIG. 7, the domain barriers 936 and 940 illustrated in FIG. 9, and the domain barriers 1006 and 1010 illustrated in FIG. 10 enable the MTJ stack to store multiple digital values. In particular, the MTJ stack illustrated in FIG. 7 may be adapted to store up to five digital values, which may be represented by the magnetic fields 712, 714, 716, 718, and 720, illustrated in FIGS. 7, 9, and 10. The digital values represented by the magnetic fields 712, 714, 716, 718, and 720 may represent up to thirty two logic states.

Figure 11:
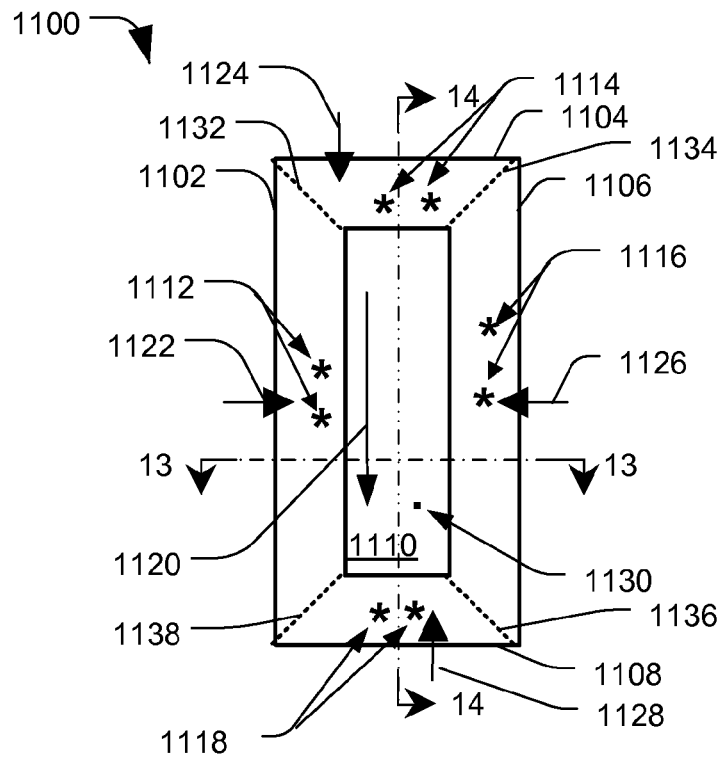
FIG. 11 is a top view of a magnetic tunnel junction (MTJ) stack with multiple vertical magnetic domains where the MTJ stack is written in a bit one state.

FIG. 11 is a top view of a magnetic tunnel junction (MTJ) stack 1100 with multiple vertical magnetic domains where the MTJ stack is written in a bit one state, where each of the bits stored at the MTJ stack 1100 has a logic high or "1" value. The MTJ stack 1100 includes sidewalls 1102, 1104, 1106, and 1108, and a bottom wall 1110. Each of the sidewalls 1102, 1104, 1106, and 1108 and the bottom wall 1110 include a fixed layer, a tunnel barrier, and a free layer. Each of the sidewalls 1102, 1104, 1106 and 1108 and the bottom wall 1110 carries a unique magnetic domain. The first sidewall 1102 includes a free layer that carries a vertical first magnetic domain 1112. The second sidewall 1104 includes a free layer that carries a vertical second magnetic domain 1114. The third sidewall 1106 includes a free layer that carries a vertical third magnetic domain 1116. The fourth sidewall 1108 includes a free layer that carries a vertical fourth magnetic domain 1118. The bottom wall 1110 includes a free layer that carries a horizontal fifth magnetic domain 1120. The MTJ stack 1100 may also include a synthesis fixed layer structure, a synthesis free layer (SyF) structure, a dual spin filter (DSF) structure, or any combination thereof.

The first magnetic domain 1112 of the first sidewall 1102 is separated from the second magnetic domain 1114 of the second sidewall 1104 by a first domain barrier 1132. Similarly, the second magnetic domain 1114 of the second sidewall 1104 is separated from the third magnetic domain 1116 of the third sidewall 1106 by a second domain barrier 1134. The third magnetic domain 1116 of the third sidewall 1106 is separated from the fourth magnetic domain 1118 of the fourth sidewall 1108 by a third domain barrier 1136. The fourth magnetic domain 1118 of the fourth sidewall 1108 is separated from the first magnetic domain 1112 of the first sidewall 1102 by a fourth domain barrier 1138.

A direction of orientation of a magnetic field associated with the first magnetic domain 1112 at a free layer of the first sidewall 1102 may be altered using a write current 1122. Similarly, a direction of orientation of a magnetic field associated with the second magnetic domain 1114 in the second sidewall 1104 may be altered using a write current 1124. A direction of orientation of a magnetic field associated with the third magnetic domain 1116 carried by the free layer in the third sidewall 1106 may be altered using a write current 1126. A direction of orientation of a magnetic field associated with the fourth magnetic domain 1118 in the fourth sidewall 1108 may be altered using a write current 1128. A direction of a magnetic field associated with the fifth magnetic domain 1120 in the bottom wall 1110 may be altered using a write current 1130.

In general, a relative direction of the magnetic field of the first magnetic domain 1112 carried by the free layer relative to a direction of orientation of a fixed magnetic field in the fixed layer of each of the sidewalls 1102, 1104, 1106, and 1108 determines the bit value stored by that particular sidewall. In the example shown, the fixed layer and free layer magnetic directions are in an anti-parallel relationship. Each of the write currents 1122, 1124, 1126 and 1128 may represent write "1" currents, which can be used to selectively orient a direction of the magnetic fields of the vertical magnetic domains 1112, 1114, 1116, 1118 to represent a value of "1" at each of the sidewalls 1102, 1104, 1106, and 1108, respectively. Additionally, the write current 1130 may represent a write "1" current, which can be used to selectively orient the magnetic field of the horizontal fifth magnetic domain 1120 at the bottom wall 1110.

Figure 12:
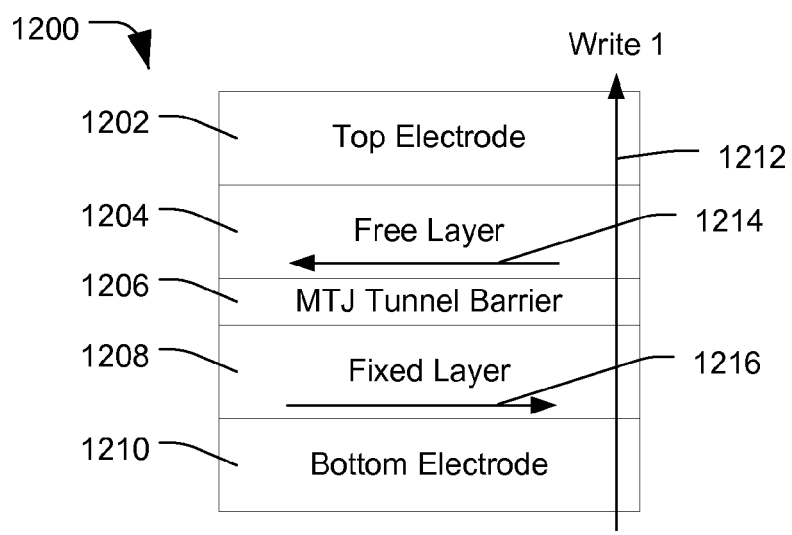
FIG. 12 is a diagram of a particular illustrative embodiment of layers of a magnetic tunnel junction (MTJ) structure illustrating a write one current flow direction.

FIG. 12 is a diagram of a particular illustrative embodiment of layers of a magnetic tunnel junction (MTJ) structure illustrating a write one current flow direction. A MTJ stack 1200 includes a top electrode 1202, a free layer 1204, a magnetic tunnel junction tunnel barrier 1206, a fixed layer 1208, and a bottom electrode 1210. An anti-ferromagnetic (AF) layer (not shown) may be located between the fixed layer 1208 and the bottom electrode 1210. In general, the top electrode 1202 and the bottom electrode 1210 are electrically conductive layers adapted to carry an electrical current. The fixed layer 1208 is a ferromagnetic layer that has been annealed, such as to be pinned by an anti-ferromagnetic layer, to fix a direction of a magnetic field 1216 within the fixed layer 1208. The free layer 1204 is also a ferromagnetic layer that may be programmed by write current. The MTJ tunnel barrier or barrier layer 1206 may be formed from an oxide barrier layer (i.e., MgO, Al$_2$O$_3$, etc,) or other diamagnetic material. The direction of a magnetic field 1214 within the free layer 1204 may be changed using a write current 1212.

A direction of the magnetic field 1214 carried by the free layer 1204 relative to the fixed magnetic field 1216 of the fixed layer 1208 indicates whether the data bit stored in the particular MTJ stack 1200 is a bit value of "1" or bit value of "0." In this example, the magnetic field 1214 within the free layer 1204 is oriented in a direction that is opposite a direction of the magnetic field 1216 within the fixed layer 1208, representing a data value of "1". The direction of the magnetic field 1214 in the free layer 1204 may be changed using the write current 1212. As shown, the write current represent a write "1" current that flows from the bottom electrode 1210 through the fixed layer 1208 across the magnetic tunnel junction barrier 1206 through the free layer 1204 and through the top electrode 1202.

Figure 13:
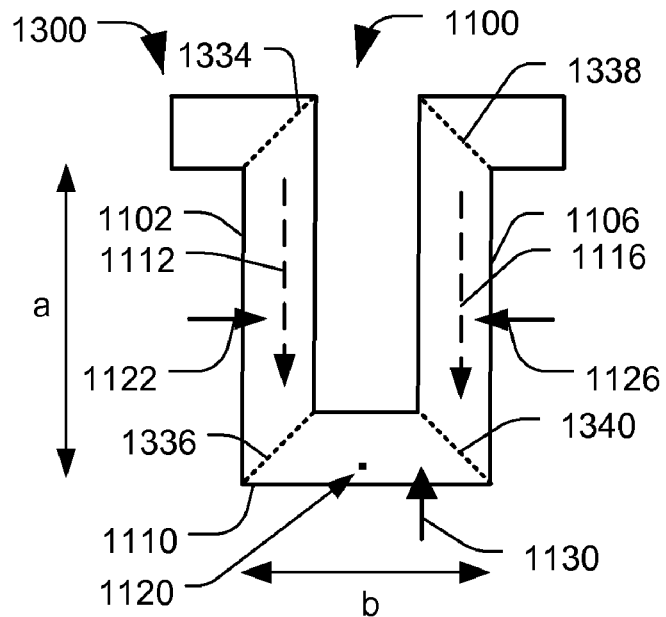
FIG. 13 is a cross-sectional view of the MTJ stack of FIG. 11 taken along line 13-13 in FIG. 11.

FIG. 13 is a cross-sectional view 1300 of the MTJ stack 1100 of FIG. 11 taken along line 13-13 in FIG. 11. The MTJ stack 1100 includes the sidewalls 1102 and 1106 and the bottom wall 1110. In this example, a direction of a magnetic field that is carried by the free layer in the first sidewall 1102, as indicated at 1112, extends as indicated by the arrow 1112 illustrated in FIG. 13. In the particular cross-sectional view of FIG. 13, the magnetic field 1112 extends along the page and in a direction toward the bottom wall 1110. The magnetic field 1116 carried by the free layer of the third sidewall 1106 extends along the page and in a direction toward the bottom wall 1110.

The MTJ stack 1100 includes a first domain barrier 1334 and a second domain barrier 1336. In a particular example, the second domain barrier 1336 may correspond to a structural interface between the first sidewall 1102 and the bottom wall 1110. The second domain barrier 1336 isolates the first magnetic domain 1112 of the free layer of the first sidewall 1102 from the fifth magnetic domain 1120 of the bottom wall 1110. The MTJ stack 1100 also includes a domain barrier 1338 and a domain barrier 1340. The domain barrier 1340 may correspond to a structural interface between the bottom wall 1110 and the third sidewall 1106. The domain barrier 1340 isolates a magnetic field 1116 of the free layer of the sidewall 1106 from the magnetic field 1120 of the free layer associated with the bottom wall 1110.

In the embodiment illustrated in FIG. 13, the MTJ stack 1100 may be configured to store at least three digital values. A first digital value, such as a data bit, may be represented by the magnetic field 1112 carried by the free layer of the sidewall 1102. A second digital value may be represented by the magnetic field 1120 carried by the free layer of the bottom wall 1110. A third digital value may be represented by the magnetic field 1116 carried by the free layer of the sidewall 1106. In a particular example, a data bit having a "1" value or a logic high value may be written to the magnetic domains of the vertical sidewalls 1102 and 1106 and to the magnetic domain of the horizontal bottom wall 1110 via write currents 1122, 1126, and 1130, respectively. The write currents 1122, 1126, and 1130 may be applied to selectively alter an orientation of the magnetic field (e.g., the magnetic field 1112) of a selected sidewall (e.g., the first sidewall 1102) without altering the orientation of the magnetic field (e.g., the magnetic field 1116) associated with the other sidewall (e.g. the sidewall 1106) and without altering the orientation of the magnetic field 1120 of the bottom wall 1110. Similarly, the orientation of the magnetic fields 1120 and 1116 may be altered independently.

Figure 14:
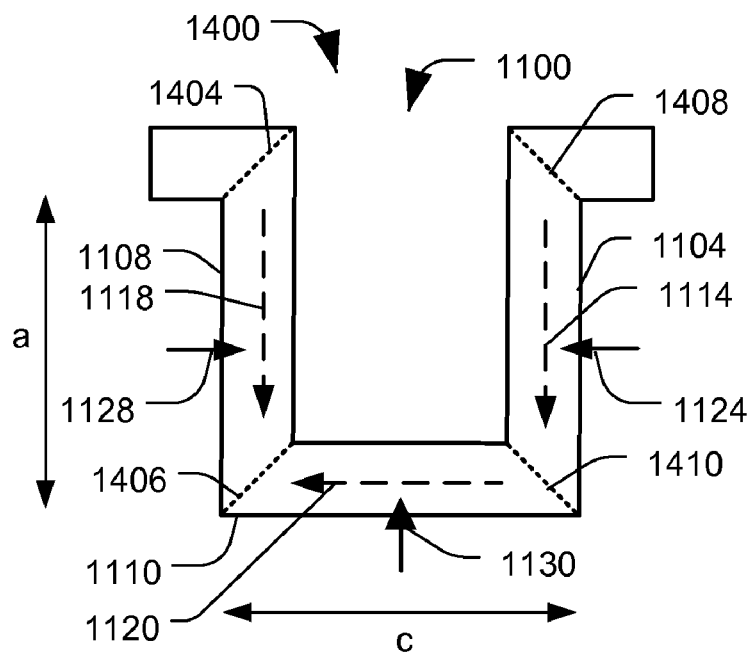
FIG. 14 is a cross-sectional view of the MTJ stack of FIG. 11 taken along line 14-14 in FIG. 11.

FIG. 14 is a cross-sectional view of the MTJ stack 1100 of FIG. 11 taken along line 14-14 in FIG. 11. The MTJ stack 1100 includes the sidewalls 1108 and 1104. In this particular example, the MTJ stack 1100 includes the magnetic domains barriers 1404 and 1406. The magnetic domain barrier (or wall) 1406 isolates the magnetic domain 1118 carried by the free layer of the sidewall 1108 from the magnetic domain 1120 carried by the free layer of the bottom wall 1110. Additionally, the MTJ stack 1100 includes the magnetic domain barriers 1408 and 1410. The domain barrier 1410 may correspond to a structural interface between the sidewall 1104 and the bottom wall 1110. The domain barrier 1410 isolates the magnetic field 1114 carried by the free layer of the sidewall 1104 from the magnetic field 1120 carried by the free layer of the bottom wall 1110. The write currents 1128, 1130, and 1124 may be used to alter an orientation of the magnetic fields 1118, 1120, and 1114, respectively. In a particular embodiment, the write currents 1128, 1130 and 1124 may be applied independently to selectively alter a magnetic orientation of a magnetic field associated with a selected sidewall (e.g., the magnetic field 1118 of the sidewall 1108) without altering a magnetic orientation associated with the magnetic fields of the sidewall 1104 or the bottom wall 1110 (i.e., the magnetic fields 1114 and 1120, respectively).

Figure 15:
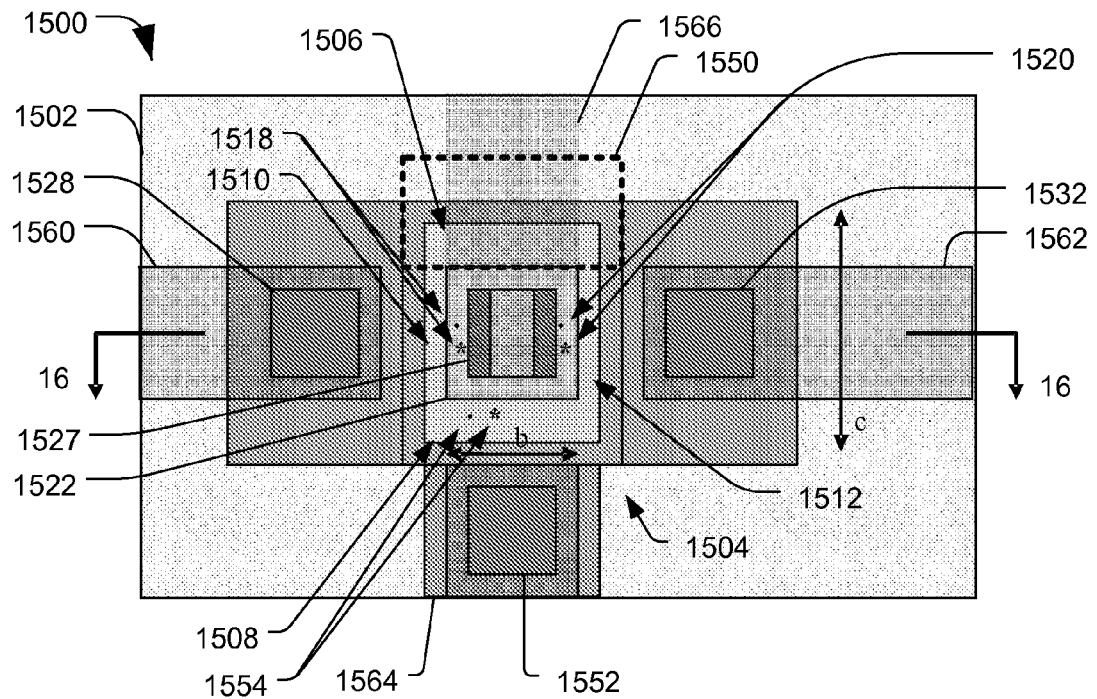
FIG. 15 is a top view of a fourth illustrative embodiment of a memory device including a magnetic tunnel junction (MTJ) cell with multiple vertical magnetic domains.

FIG. 15 is a top view of a fourth illustrative embodiment of a memory device including a magnetic tunnel junction (MTJ) cell with multiple vertical magnetic domains. The memory device 1500 includes a substrate 1502 with a magnetic tunnel junction (MTJ) cell 1504 with multiple vertical magnetic domains. Sidewall material under a mask area 1550 has been removed to remove a first sidewall 1506 of the MTJ cell 1504. The MTJ cell 1504 includes a second sidewall 1508, a third sidewall 1510, and a fourth sidewall 1512 arranged in a substantially U-shape. The device 1500 also includes electrical terminals, such as a first terminal 1528, a second terminal 1532, and a third terminal 1552 to access the MTJ cell 1504. A fourth terminal 1522 is coupled to an electrode 1527 of the MTJ cell 1504. The terminals 1528, 1532, 1552, and 1522 are coupled to wires 1560, 1562, 1564, and 1566, respectively.

Each of the sidewalls 1508, 1510, and 1512 includes a fixed layer, a tunnel barrier, and a free layer. Additional layers, such as an anti-ferromagntic (AF) layer, may be included. The fixed layer is generally annealed, such as to be pinned by an AF layer, to fix a direction of a magnetic domain that is carried by the fixed layer. The tunnel barrier may be an oxide barrier layer (i.e., MgO, Al$_2$O$_3$, etc,) or other diamagnetic layer that is adapted to provide a tunnel junction or barrier between the fixed layer and the free layer. The free layer is formed from a ferromagnetic material that carries a programmable (writeable) magnetic domain, which can be altered to store a data value (i.e., a "1" or a "0" data value). The sidewall 1508 carries a vertical magnetic domain 1554 that is accessible via the terminal 1552. The sidewall 1510 carries a vertical magnetic domain 1518 that is accessible via the terminal 1528. The sidewall 1512 carries a vertical magnetic domain 1520 that is accessible via the terminal 1532. The field direction symbols (.) and (*) indicate possible directions of a magnetic field in the domain (out of the page and into the page, respectively). The terminal 1522 is coupled to the electrode 1527, which includes a center component 1526 (depicted in FIG. 16) that extends proximate to each of the sidewalls 1508, 1510, and 1512.

Figure 16:
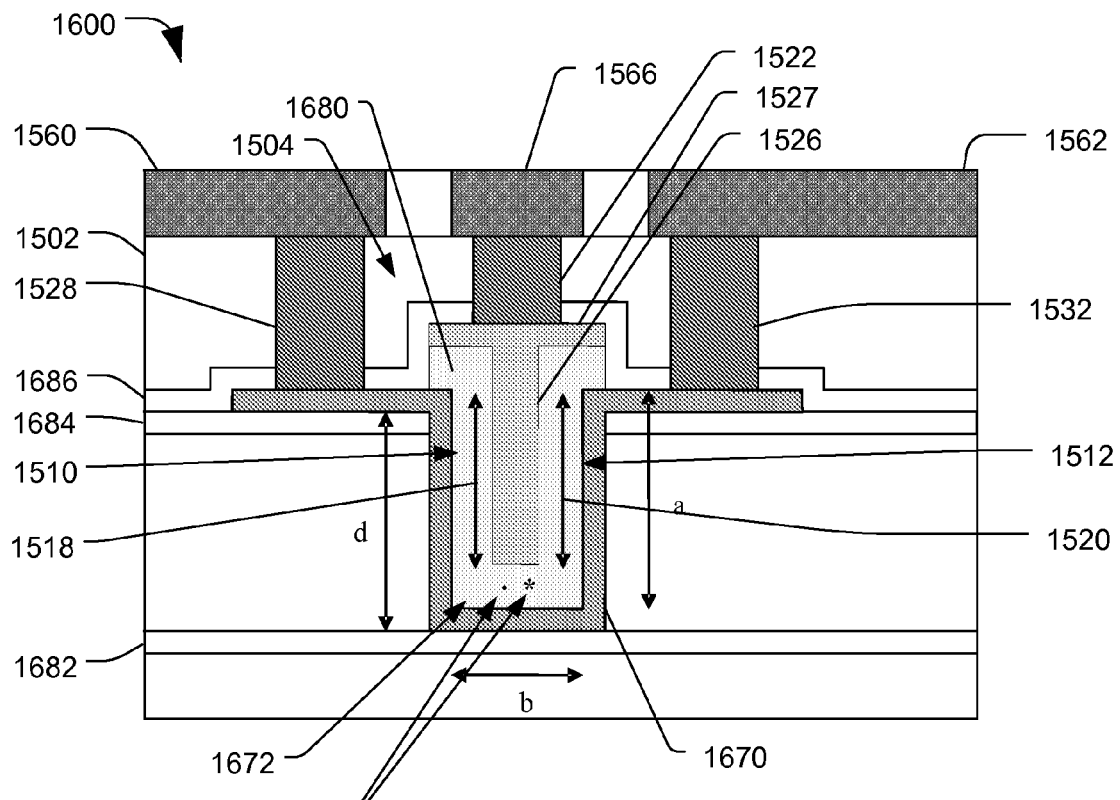
FIG. 16 is a cross-sectional view of the memory device of FIG. 15 taken along line 16-16 in FIG. 15.

FIG. 16 is a cross-sectional view of the memory device of FIG. 15 taken along line 16-16 in FIG. 15. The cross-sectional view 1600 shows the substrate 1502 including the magnetic tunnel junction (MTJ) cell 1504. In this view, the cross-section is taken lengthwise through the MTJ cell 1504. The electrode 1527 includes the center component 1526 that is proximate to each of the sidewalls 1510 and 1512 and that is spaced approximately equally from a bottom electrode 1670 along each of the sidewalls 1510 and 1512 and a bottom wall 1672. The MTJ cell 1504 includes a magnetic tunnel junction (MTJ) stack 1680 and capping layers 1682, 1684, and 1686. The MTJ stack 1680 includes the sidewalls 1510 and 1512, which are adapted to carry unique vertical magnetic domains representing stored digital values. The MTJ stack 1680 is located in a trench having depth (d).

The bottom electrode 1670 extends along the bottom wall 1672 of the MTJ cell 1504 and also extends along the sidewalls 1510 and 1512. The MTJ stack 1680 carries multiple unique vertical magnetic domains 1518, 1520, and 1554 along a vertical height (a) of the sidewalls 1510, 1512, and 1508, respectively. In a particular embodiment, the MTJ cell 1504 includes lateral dimensions (b) and (c) that are less than sidewall height (a), which is approximately equal to the trench depth (d).

In general, when a height (a) of a sidewall 1508, 1510, or 1512 is greater than a width (b) or (c) of the sidewall, a magnetic field within the sidewall aligns to a longitudinal sidewall direction oriented vertically along the height (a). In a particular embodiment, by removing the first sidewall 1506, MTJ device 1500, in which magnetic fields in the vertical sidewalls are oriented vertically.

The MTJ stack 1680 that is proximate to the bottom wall 1672 carries another unique magnetic domain 1674, which extends in a longitudinal direction (i.e., along the direction (c) in FIG. 15 and normal to the page in FIG. 16). Because a length (c) of the bottom wall 1672 is greater than a width (b) of the bottom wall 1672, the magnetic domain 1674 is oriented in a direction of the length (c).

Figure 17:
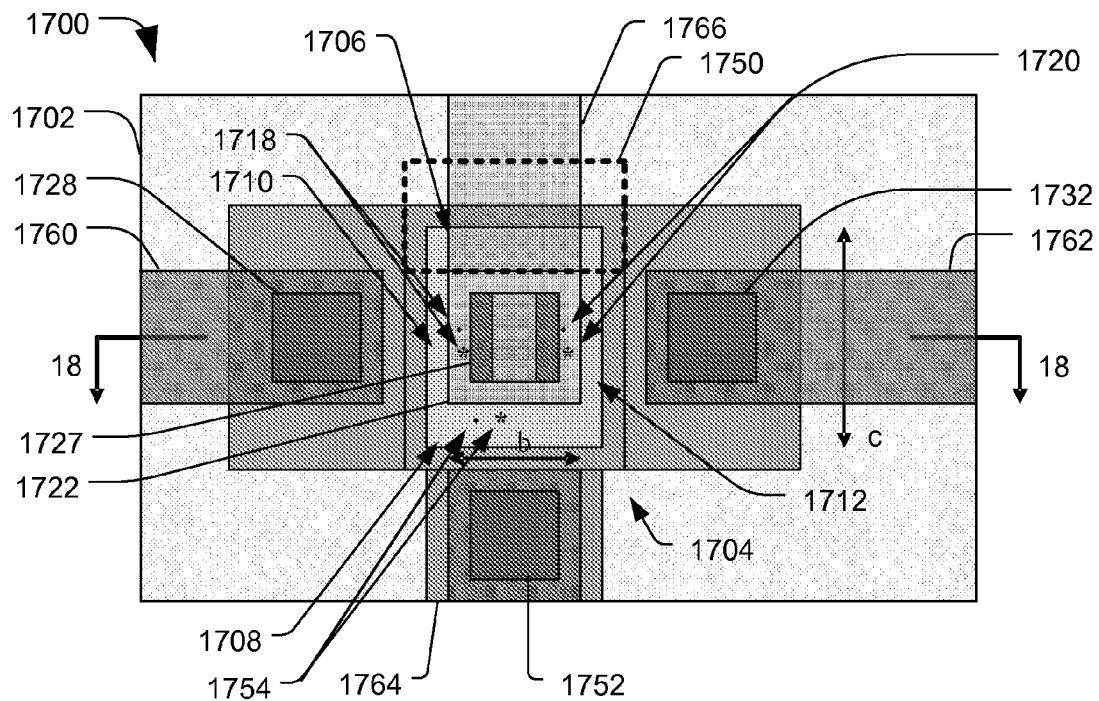
FIG. 17 is a top view of a fifth illustrative embodiment of a memory device including a magnetic tunnel junction (MTJ) cell with multiple vertical magnetic domains.

FIG. 17 is a top view of a fifth illustrative embodiment of a memory device including a magnetic tunnel junction (MTJ) cell with multiple vertical magnetic domains. The memory device 1700 includes a substrate 1702 with a magnetic tunnel junction (MTJ) cell 1704 with multiple vertical magnetic domains. Sidewall material under a mask area 1750 has been removed to remove a first sidewall 1706 of the MTJ cell. The MTJ cell 1704 includes a second sidewall 1708, a third sidewall 1710, and a fourth sidewall 1712 arranged in a substantially U-shape. The device 1700 also includes electrical terminals, such as a first terminal 1728, a second terminal 1732, and a third terminal 1752 to access the MTJ cell 1704. The device 1700 also includes a fourth terminal 1722 to couple to an electrode 1727 of the MTJ cell 1704. The terminals 1728, 1732, and 1752 are coupled to bottom wires 1760, 1762, and 1764, respectively, and the terminal 1722 is coupled to a top wire 1766.

Each of the sidewalls 1708, 1710, and 1712 includes a fixed layer, a tunnel barrier, and a free layer. The fixed layer is generally annealed to be pinned by an anti-ferromagnetic film layer (not shown) to fix a direction of a magnetic domain that is carried by the fixed layer. The tunnel barrier may be an oxide barrier layer (i.e., MgO, $Al_2O_3$, etc,) or other diamagnetic layer that is adapted to provide a tunnel junction or barrier between the fixed layer and the free layer. The free layer is formed from a ferromagnetic material that carries a programmable (writeable) magnetic domain, which can be altered to store a data value (i.e., a "1" or a "0" data value). The sidewall 1708 carries a vertical magnetic domain 1754 that is accessible via the terminal 1752. The sidewall 1710 carries a vertical magnetic domain 1718 that is accessible via the terminal 1728. The sidewall 1712 carries a vertical magnetic domain 1720 that is accessible via the terminal 1732. The field direction symbols (.) and (*) indicate possible directions of a magnetic field in the domain (out of the page and into the page, respectively). The terminal 1722 is coupled to the electrode 1727, which includes a center component 1726 (depicted in FIG. 18) that extends proximate to each of the sidewalls 1708, 1710, and 1712.

Figure 18:
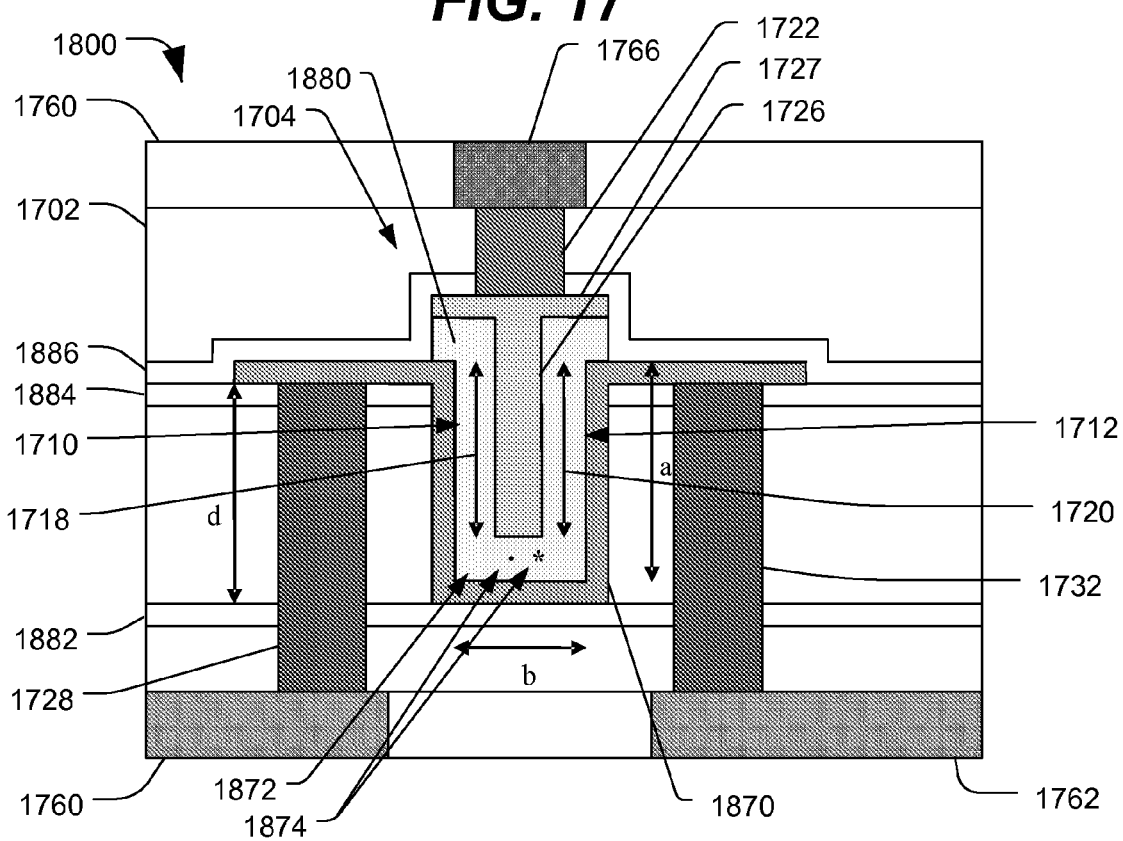
FIG. 18 is a cross-sectional view of the memory device of FIG. 17 taken along line 18-18 in FIG. 17.

FIG. 18 is a cross-sectional view of the memory device of FIG. 17 taken along line 18-18 in FIG. 17. The cross-sectional view 1800 shows the substrate 1702 including the magnetic tunnel junction (MTJ) cell 1704. In this view, the cross-section is taken lengthwise through the MTJ cell 1704. The electrode 1727 includes the center component 1726 that is proximate to each of the sidewalls 1710 and 1712 and that is spaced approximately equally from a bottom electrode 1870 along each of the sidewalls 1710 and 1712 and a bottom wall 1872. The MTJ cell 1704 includes a magnetic tunnel junction (MTJ) stack 1880 and capping layers 1882, 1884, and 1886. The MTJ stack 1880 includes the sidewalls 1710 and 1712, which are adapted to carry unique vertical magnetic domains representing stored digital values. The MTJ stack 1880 is located in a trench having depth (d).

The bottom electrode 1870 extends along the bottom wall 1872 of the MTJ cell 1704 and also extends along the sidewalls 1710 and 1712. The MTJ stack 1880 carries multiple unique vertical magnetic domains 1718, 1720, and 1754 along a vertical height (a) of the sidewalls 1710, 1712, and 1708, respectively. In a particular embodiment, the MTJ cell 1704 includes lateral dimensions (b) and (c) that are less than sidewall height (a), which is approximately equal to the trench depth (d).

In general, when a height (a) of a sidewall 1708, 1710, or 1712 is greater than a width (b) or (c) of the sidewall, a magnetic field within the sidewall is oriented vertically along the height (a). In a particular embodiment, by removing the first sidewall 1706, MTJ device 1700, in which magnetic fields in the vertical sidewalls are oriented vertically.

The MTJ stack 1880 that is proximate to the bottom wall 1872 carries another unique magnetic domain 1874, which extends in a longitudinal direction (i.e., along the direction (c) in FIG. 17 and normal to the page in FIG. 18). Because a length (c) of the bottom wall 1872 is greater than a width (b) of the bottom wall 1872, the magnetic domain 1874 is oriented in a direction of the length (c).

Figure 19:
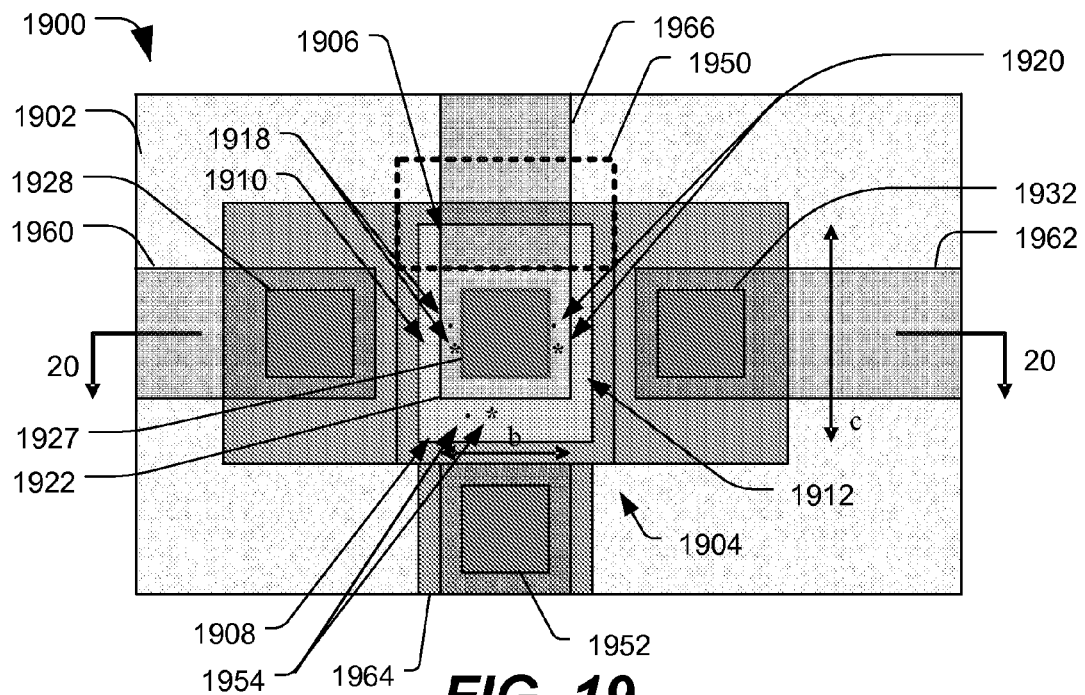
FIG. 19 is a top view of a sixth illustrative embodiment of a memory device including a magnetic tunnel junction (MTJ) cell with multiple vertical magnetic domains.

FIG. 19 is a top view of a sixth illustrative embodiment of a memory device including a magnetic tunnel junction (MTJ) cell with multiple vertical magnetic domains. The memory device 1900 includes a substrate 1902 with a magnetic tunnel junction (MTJ) cell 1904 that has multiple vertical magnetic domains and a horizontal magnetic domain. Sidewall material under a mask area 1950 has been removed to remove a first sidewall 1906 of the MTJ cell. The MTJ cell 1904 includes a second sidewall 1908, a third sidewall 1910, and a fourth sidewall 1912 arranged in a substantially U-shape. The device 1900 also includes electrical terminals, such as a first terminal 1928, a second terminal 1932, a third terminal 1952, and a fourth terminal 2090 (depicted in FIG. 20) to access the MTJ cell 1904. The device 1900 also includes a fifth terminal 1922 to couple to an electrode 1927 of the MTJ cell 1904. The terminals 1928, 1932, 1952, and 1922 are coupled to top wires 1960, 1962, 1964, and 1966, respectively, and the terminal 2090 is coupled to a bottom wire 2092.

Each of the sidewalls 1908, 1910, and 1912 includes a fixed layer, a tunnel barrier, and a free layer. The fixed layer is generally annealed to be pinned, such as by an anti-ferromagnetic film layer, to fix a direction of a magnetic domain that is carried by the fixed layer. The tunnel barrier may be an oxide barrier layer (i.e., MgO, $Al_2O_3$, etc,) or other diamagnetic layer that is adapted to provide a tunnel junction or barrier between the fixed layer and the free layer. The free layer is formed from a ferromagnetic material that carries a programmable (writeable) magnetic domain, which can be altered to store a data value (i.e., a "1" or a "0" data value). The sidewall 1908 carries a vertical magnetic domain 1954 that is accessible via the terminal 1952. The sidewall 1910 carries a vertical magnetic domain 1918 that is accessible via the terminal 1928. The sidewall 1912 carries a vertical magnetic domain 1920 that is accessible via the terminal 1932. The field direction symbols (.) and (*) indicate possible directions of a magnetic field in the domain (out of the page and into the page, respectively). The terminal 1922 is coupled to the electrode 1927, which includes a center component 1926 (depicted in FIG. 20) that extends proximate to each of the sidewalls 1908, 1910, and 1912.

Figure 20:
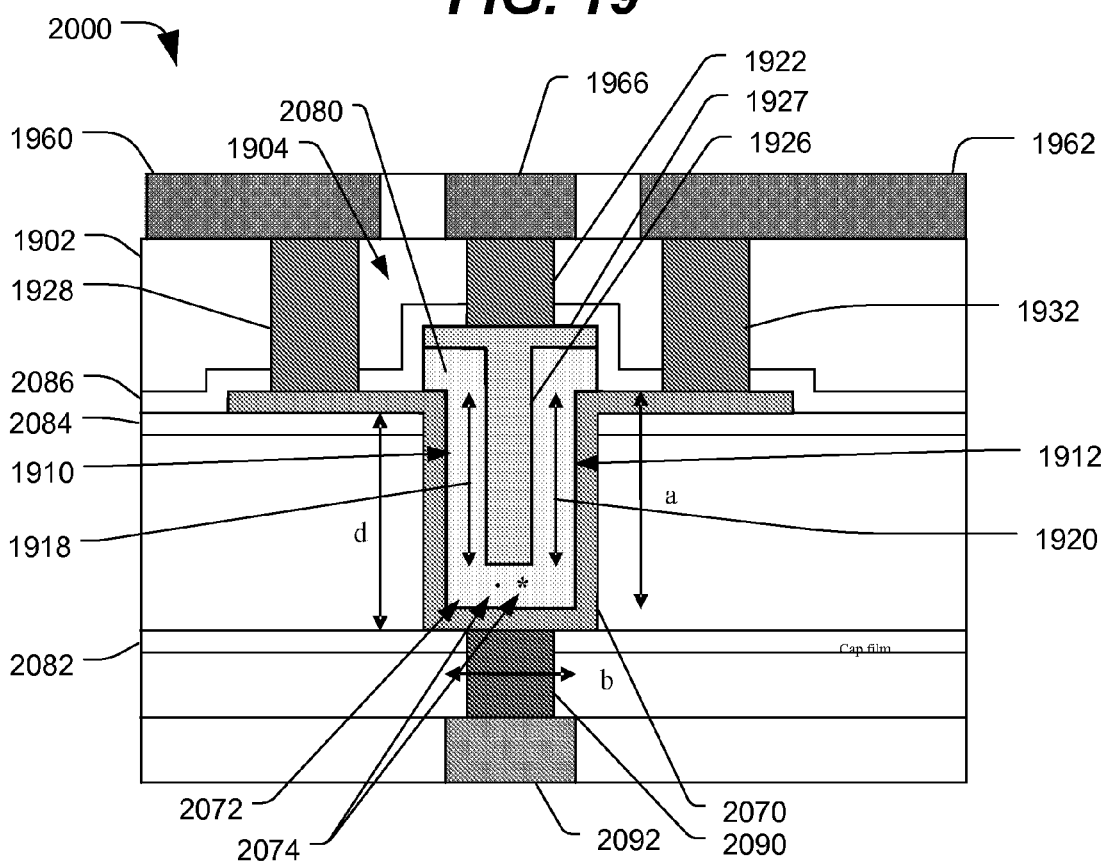
FIG. 20 is a cross-sectional view of the memory device of FIG. 19 taken along line 20-20 in FIG. 19.

FIG. 20 is a cross-sectional view of the memory device of FIG. 19 taken along line 20-20 in FIG. 19. The cross-sectional view 2000 shows the substrate 1902 including the magnetic tunnel junction (MTJ) cell 1904. In this view, the cross-section is taken lengthwise through the MTJ cell 1904. The electrode 1927 includes the center component 1926 that is proximate to each of the sidewalls 1910 and 1912 and that is spaced approximately equally from a bottom electrode 2070 along each of the sidewalls 1910 and 1912 and a bottom wall 2072. The MTJ cell 1904 includes a magnetic tunnel junction (MTJ) stack 2080 and capping layers 2082, 2084, and 2086. The MTJ stack 2080 includes the sidewalls 1910 and 1912, which are adapted to carry unique vertical magnetic domains representing stored digital values. The MTJ stack 2080 is located in a trench having depth (d).

The bottom electrode 2070 extends along the bottom wall 2072 of the MTJ cell 1904 and also extends along the sidewalls 1910 and 1912. The MTJ stack 2080 carries multiple unique vertical magnetic domains 1918, 1920, and 1954 along a vertical height (a) of the sidewalls 1910, 1912, and 1908, respectively. In a particular embodiment, the MTJ cell 1904 includes lateral dimensions (b) and (c) that are less than sidewall height (a), which is approximately equal to the trench depth (d).

In general, when a height (a) of a sidewall 1908, 1910, or 1912 is greater than a width (b) or (c) of the sidewall, a magnetic field within the sidewall is oriented vertically along the height (a). In a particular embodiment, with the first sidewall 1906 removed, the magnetic fields in the vertical sidewalls of the MTJ device 1900 are oriented vertically.

The MTJ stack 2080 that is proximate to the bottom wall 2072 carries another unique magnetic domain 2074, which extends in a longitudinal direction (i.e., along the direction (c) in FIG. 19 and normal to the page in FIG. 20). Because a length (c) of the bottom wall 2072 is greater than a width (b) of the bottom wall 2072, the magnetic domain 2074 is oriented in a direction of the length (c).

Each magnetic domain of the MTJ device 1904 is independently accessible. For example, each of the vertical magnetic domains 1918, 1920, and 1954 is accessible via a corresponding terminal 1928, 1932, and 1952, respectively. The horizontal magnetic domain 2074 is also accessible via the bottom terminal 2090. Thus, data values may be read from or written to each of the magnetic domains 1918, 1920, 1954, and 2074 independently.

Figure 21:
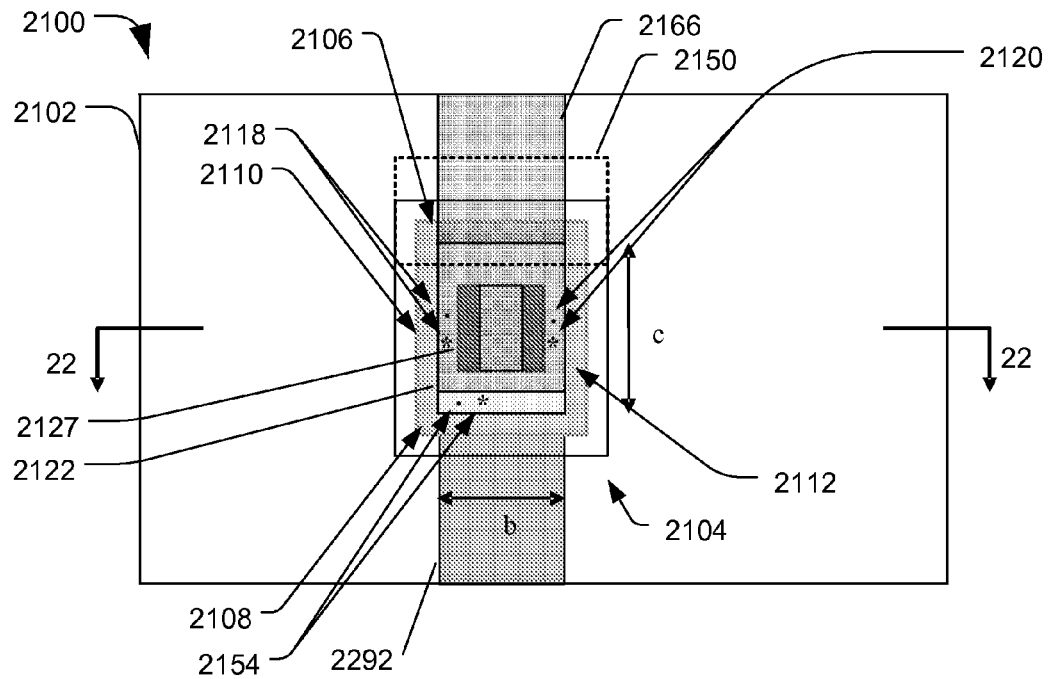
FIG. 21 is a top view of a seventh illustrative embodiment of a memory device including a magnetic tunnel junction (MTJ) cell with multiple vertical magnetic domains.

FIG. 21 is a top view of a seventh illustrative embodiment of a memory device including a magnetic tunnel junction (MTJ) cell with multiple vertical magnetic domains. The memory device 2100 includes a substrate 2102 with a magnetic tunnel junction (MTJ) cell 2104 that has multiple vertical magnetic domains and a horizontal magnetic domain. Material under a mask area 2150 has been removed to remove a first sidewall 2106 of the MTJ cell 2104. The MTJ cell 2104 includes a second sidewall 2108, a third sidewall 2110, and a fourth sidewall 2112 arranged in a substantially U-shape. The device 2100 includes a first terminal 2290 (depicted in FIG. 22) to access the MTJ cell 2104. The device 2100 also includes a second terminal 2122 to couple to an electrode 2127 of the MTJ cell 2104. The terminal 2122 is coupled to a top wire 2166, and the terminal 2290 is coupled to a bottom wire 2292.

Each of the sidewalls 2108, 2110, and 2112 includes a fixed layer, a tunnel barrier, and a free layer. The fixed layer is generally annealed to fix a direction of a magnetic domain that is carried by the fixed layer. The tunnel barrier may be an oxide barrier layer (i.e., MgO, $Al_2O_3$, etc,) or other diamagnetic layer that is adapted to provide a tunnel junction or barrier between the fixed layer and the free layer. The free layer is formed from a ferromagnetic material that carries a programmable (writeable) magnetic domain, which can be altered to store a data value (i.e., a "1" or a "0" data value). The sidewalls 2108, 2110, and 2112 carry vertical magnetic domains 2154, 2118, and 2120, respectively. The field direction symbols (.) and (*) indicate possible directions of a magnetic field in the domain (out of the page and into the page, respectively). The terminal 2122 is coupled to the electrode 2127, which includes a center component 2126 (depicted in FIG. 22) that extends proximate to each of the sidewalls 2108, 2110, and 2112.

Figure 22:
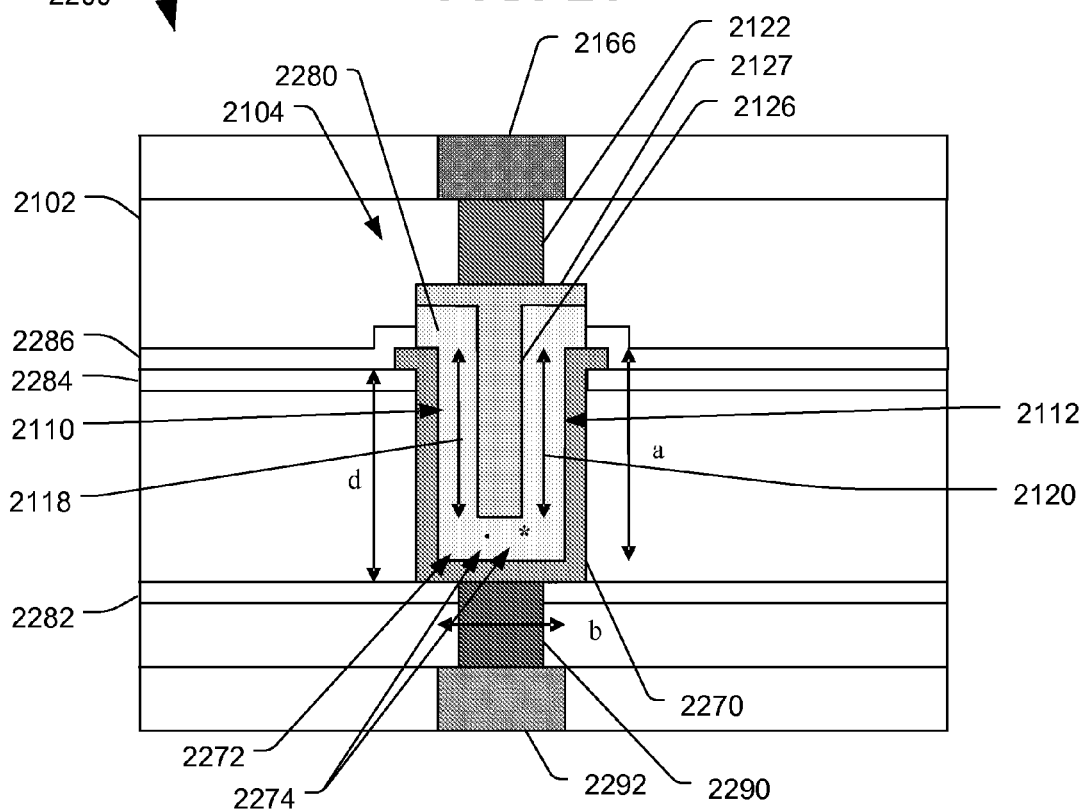
FIG. 22 is a cross-sectional view of the memory device of FIG. 21 taken along line 22-22 in FIG. 21.

FIG. 22 is a cross-sectional view of the memory device of FIG. 21 taken along line 22-22 in FIG. 21. The cross-sectional view 2200 shows the substrate 2102 including the magnetic tunnel junction (MTJ) cell 2104. In this view, the cross-section is taken lengthwise through the MTJ cell 2104. The electrode 2127 includes the center component 2126 that is proximate to each of the sidewalls 2110 and 2112 and that is spaced approximately equally from a bottom electrode 2270 along each of the sidewalls 2110 and 2112 and a bottom wall 2272. The MTJ cell 2104 includes a magnetic tunnel junction (MTJ) stack 2280 and capping layers 2282, 2284, and 2286. The MTJ stack 2280 is located in a trench having depth (d).

The bottom electrode 2270 extends along the bottom wall 2272 of the MTJ cell 2104 and also extends along the sidewalls 2110 and 2112. The MTJ stack 2280 carries multiple unique vertical magnetic domains 2118, 2120, and 2154 along a vertical height (a) of the sidewalls 2110, 2112, and 2108, respectively. In a particular embodiment, the MTJ cell 2104 includes lateral dimensions (b) and (c) that are less than sidewall height (a), which is approximately equal to the trench depth (d).

In general, when a height (a) of a sidewall 2108, 2110, or 2112 is greater than a width (b) or (c) of the sidewall, a magnetic field within the sidewall has oriented vertically along the height (a). In a particular embodiment, with the first sidewall 2106 removed, the magnetic fields in the vertical sidewalls of the MTJ device 2100 are oriented vertically.

The MTJ stack 2280 that is proximate to the bottom wall 2272 carries another unique magnetic domain 2274, which extends in a longitudinal direction (i.e., along the direction (c) in FIG. 21 and normal to the page in FIG. 22). Because a length (c) of the bottom wall 2272 is greater than a width (b) of the bottom wall 2272, the magnetic domain 2274 is oriented in a direction of the length (c).

FIG. 23 is a top view of a second illustrative embodiment of a magnetic tunnel junction (MTJ) stack with multiple vertical magnetic domains where the MTJ cell is written in a bit zero state. In this example, the MTJ stack 2300 is illustrated in a bit zero state, where each of the bits represents a zero value. The MTJ stack 2300 includes a first sidewall 2302, a second sidewall 2306, a third sidewall 2308, and a bottom wall 2558 (depicted in FIG. 25). A sidewall opposite the third sidewall 2308 has been removed to form a U-shaped structure. Each of the sidewalls 2302, 2306, and 2308 and the bottom wall 2558 may include a fixed layer, a tunnel barrier, a free layer, and an anti-ferromagnetic film (AF) layer, in addition to one or more additional layers. The free layers of each of the sidewalls 2302, 2306, and 2308 carry unique vertical magnetic domains and the free layer of the bottom wall 2558 carries a unique magnetic domain configured to represent a data value, such as a "1" or a "0" value. The first sidewall 2302 includes a free layer that carries a vertical first magnetic domain 2312. The second sidewall 2306 includes a free layer that carries a vertical second magnetic domain 2316. The third sidewall 2308 includes a free layer that carries a vertical third magnetic domain 2318. The bottom wall 2558 includes a free layer that carries a horizontal fourth magnetic domain 2320.

The first magnetic domain 2312 of the first sidewall 2302 is separated from the third magnetic domain 2318 of the third sidewall 2308 by a first domain barrier 2338. The second magnetic domain 2316 of the second sidewall 2306 is also separated from the third magnetic domain 2318 of the third sidewall 2308 by a second domain barrier 2336. In general, the domain barriers 2336 and 2338 represent domain walls, which are interfaces that separate magnetic domains, such as the magnetic domains 2312, 2316, and 2318. Such domain barriers 2336 and 2338 represent a transition between different magnetic moments. In a particular embodiment, the domain barriers 2336 and 2338 may represent a change in a magnetic moment where a magnetic field undergoes an angular displacement of 0 or 180 degrees.

The direction of a magnetic field associated with the first magnetic domain 2312 (i.e., a direction of a magnetic field within a free layer) in the first sidewall 2302 may be altered using a first write current 2322. A direction of a magnetic field associated with the second magnetic domain 2316 that is carried by a free layer in the second sidewall 2306 may be altered using a second write current 2326. A direction of a magnetic field associated with the third magnetic domain 2318 carried by a free layer of the third sidewall 2308 may be altered using a third write current 2328. A direction of a magnetic field associated with the fourth magnetic domain 2320 carried by a free layer of the bottom wall 2558 may be altered using a fourth write current 2330.

In general, a relative direction of the magnetic field carried by the free layer relative to a fixed magnetic field in the fixed layer of each of the sidewalls 2302, 2306, 2308, and a bottom wall 2558 (depicted in FIG. 25) determines the bit value stored by that particular sidewall. In the example shown, the fixed layer and free layer magnetic directions are in parallel (as illustrated in by magnetic fields 2414 and 2416 in FIG. 24). Accordingly, the write currents 2322, 2326, 2328, and 2330 may represent write "0" currents, placing the MTJ stack 2300 in a reset or "0" state.

FIG. 24 is a diagram of a second illustrative embodiment of layers of a magnetic tunnel junction (MTJ) stack 2400 illustrating a write zero current flow direction. The MTJ structure 2400 includes a top electrode 2402, a free layer 2404, a magnetic tunnel junction tunnel barrier 2406, a fixed layer 2408, and a bottom electrode 2410. The MTJ stack 2400 may also include an anti-ferromagnetic (AF) layer (not shown) between the fixed layer 2408 and the bottom electrode 2410. In general, the top electrode 2402 and the bottom electrode 2410 are electrically conductive layers adapted to carry an electrical current. The fixed layer 2408 is a ferromagnetic layer that has been annealed, such as to be pinned by an anti-ferromagnetic (AF) layer, to fix a direction of a magnetic field 2416 within the fixed layer 2408. The free layer 2404 is a ferromagnetic layer that can be programmed via a write current. The MTJ tunnel barrier or barrier layer 2406 may be formed from an oxide barrier layer (i.e., MgO, $Al_2O_3$, etc,) or other diamagnetic material. The direction of a magnetic field 2414 within the free layer 2404 may be changed using the write current. In a particular embodiment, the MTJ stack 2400 can also include a synthesis fixed layer structure, a synthesis free layer (SyF) structure, a dual spin filter (DSF) structure, or any combination thereof.

A direction of the magnetic fields in the free layer 2404 relative to the fixed magnetic field of the fixed layer 2408 indicates whether the data bit stored at the free layer 2404 of the particular MTJ structure 2400 is a bit value of "1" or bit value of "0." The magnetic direction of the magnetic field in the free layer 2404, generally indicated at 2414, may be changed using a write current 2412. As shown, the write current represent a write 0 current that flows from the top electrode 2402 through the free layer 2404, across the magnetic tunnel junction barrier 2406, through the fixed layer 2408, and through the bottom electrode 2410.

FIG. 25 is a cross-sectional view 2500 of the MTJ stack of FIG. 23 taken along line 25-25 in FIG. 23. The MTJ stack includes the first sidewall 2302, the second sidewall 2306 and the bottom wall 2558. In this example, a direction of a first magnetic field carried by the free layer in the first sidewall 2302, as indicated at 2312, extends vertically along the first sidewall 2302 and in a direction corresponding to the arrow 2312. A direction of a second magnetic field carried by the free layer of the second sidewall 2306, as indicated at 2316, extends vertically along the second sidewall 2306 and in a direction corresponding to the arrow 2316.

The MTJ stack includes a first domain barrier (wall) 2554 and a second domain barrier 2550. In a particular example, the second domain barrier 2550 may correspond to a structural interface between the sidewall 2302 and the bottom wall 2558. The second domain barrier 2550 isolates the first magnetic domain 2312 of the free layer of the first sidewall 2302 from the fourth magnetic domain 2320 at the bottom wall 2558. The MTJ stack also includes a third domain barrier 2556 and a fourth domain barrier 2552. The fourth domain barrier 2552 may correspond to a structural interface between the bottom wall 2558 and the sidewall 2306. The fourth domain barrier 2552 isolates the magnetic field 2316 of a free layer of the sidewall 2306 from the magnetic field 2320 of the free layer associated with the bottom wall 2558.

In the embodiment illustrated in FIG. 25, the MTJ stack may be adapted to store at least three data bits. A first data bit may be represented by the first magnetic field 2312 carried by a free layer of the first sidewall 2302. A second data bit may be represented by the fourth magnetic field 2320 carried by a free layer of the bottom wall 2558. A third data bit may be represented by the second magnetic field 2316 carried by a free layer of the second sidewall 2306. The write currents 2322, 2326, and 2330 may be applied to selectively alter an orientation of the magnetic field of a selected sidewall without altering the orientation of the magnetic field associated with the other sidewall or of the bottom wall 2558, for example.

FIG. 26 is a cross-sectional view 2600 of the MTJ stack of FIG. 23 taken along line 26-26 in FIG. 23. In this particular example, the MTJ stack includes magnetic domains barriers 2660 and 2662. The magnetic domain barrier (or wall) 2662 isolates the magnetic domain 2318 carried by a free layer of the sidewall 2308 from the magnetic domain 2320 carried by a free layer of the bottom wall 2558.

In a particular illustrative embodiment, the domain barriers 2336 and 2338 illustrated in FIG. 23, the domain barriers 2550 and 2552 illustrated in FIG. 25, and the domain barrier 2662 illustrated in FIG. 26 allow the MTJ stack to store multiple digital values. In particular, the MTJ stack illustrated in FIG. 23 may be adapted to store up to four digital values, which may be represented by the magnetic fields 2312, 2316, 2318, and 2320, illustrated in FIGS. 23, 25, and 26. The four digital values may represent up to sixteen logic states.

FIG. 27 is a top view of a second illustrative embodiment of a magnetic tunnel junction (MTJ) stack with multiple vertical magnetic domains where the MTJ cell is written in a bit one state. In this example, the MTJ stack 2700 is illustrated in a bit one state, where each of the bits represents a logical one value. The MTJ stack 2700 includes a first sidewall 2702, a second sidewall 2706, a third sidewall 2708, and a bottom wall 2958 (depicted in FIG. 29). A sidewall opposite the third sidewall 2708 has been removed to form a U-shaped structure. Each of the sidewalls 2702, 2706, and 2708 and the bottom wall 2958 include a fixed layer, a tunnel barrier, and a free layer. The free layers of each of the sidewalls 2702, 2706, and 2708 carry unique vertical magnetic domains and the free layer of the bottom wall 2958 carries a unique magnetic domain configured to represent a data value, such as a "1" or a "0" value. The first sidewall 2702 includes a free layer that carries a vertical first magnetic domain 2712. The second sidewall 2706 includes a free layer that carries a vertical second magnetic domain 2716. The third sidewall 2708 includes a free layer that carries a vertical third magnetic domain 2718. The bottom wall 2958 includes a free layer that carries a horizontal fourth magnetic domain 2720.

The first magnetic domain 2712 of the first sidewall 2702 is separated from the third magnetic domain 2718 of the third sidewall 2708 by a first domain barrier 2738. The second magnetic domain 2716 of the second sidewall 2706 is also separated from the third magnetic domain 2718 of the third sidewall 2708 by a second domain barrier 2736. In general, the domain barriers 2736 and 2738 represent domain walls, which are interfaces that separate magnetic domains, such as the magnetic domains 2712, 2716, and 2718. Such domain barriers 2736 and 2738 represent a transition between different magnetic moments. In a particular embodiment, the domain barriers 2736 and 2738 may represent a change in a magnetic moment where a magnetic field undergoes an angular displacement of 0 or 180 degrees.

The direction of a magnetic field associated with the first magnetic domain 2712 (i.e., a direction of a magnetic field within a free layer) in the first sidewall 2702 may be altered using a first write current 2722. A direction of a magnetic field associated with the second magnetic domain 2716 that is carried by a free layer in the second sidewall 2706 may be altered using a second write current 2726. A direction of a magnetic field associated with the third magnetic domain 2718 carried by a free layer of the third sidewall 2708 may be altered using a third write current 2728. A direction of a magnetic field associated with the fourth magnetic domain 2720 carried by a free layer of the bottom wall 2958 may be altered using a fourth write current 2730.

In general, a relative direction of the magnetic field carried by the free layer relative to a fixed magnetic field in the fixed layer of each of the sidewalls 2702, 2706, and 2708 determines the bit value stored by that particular sidewall. In the example shown, the fixed layer and free layer magnetic directions are antiparallel (as illustrated in by magnetic fields 2814 and 2816 in FIG. 28). Accordingly, the write currents 2722, 2726, 2728, and 2730 may represent write "1" currents, placing the MTJ stack 2700 in a "1" state.

FIG. 28 is a diagram of a second illustrative embodiment of layers of a magnetic tunnel junction (MTJ) stack 2800 illustrating a write one current flow direction. The MTJ structure 2800 includes a top electrode 2802, a free layer 2804, a magnetic tunnel junction tunnel barrier 2806, a fixed layer 2808, and a bottom electrode 2810. The MTJ stack 2800 may also include an anti-ferromagnetic (AF) layer (not shown). In general, the top electrode 2802 and the bottom electrode 2810 are electrically conductive layers adapted to carry an electrical current. The fixed layer 2808 is a ferromagnetic layer that has been annealed, such as to be pinned by an anti-ferromagnetic layer, to fix a direction of a magnetic field 2816 within the fixed layer 2808. The free layer 2804 is a ferromagnetic layer that can be programmed by a write current. The MTJ tunnel barrier or barrier layer 2806 may be formed from an oxide barrier layer (i.e., $MgO$, $Al_2O_3$, etc,) or other diamagnetic material. The direction of a magnetic field 2814 within the free layer 2804 may be changed using the write current.

A direction of the magnetic fields in the free layer 2804 relative to the fixed magnetic field of the fixed layer 2808 indicates whether the data bit stored at the free layer 2804 of the particular MTJ cell 2800 is a bit value of "1" or bit value of "0." The magnetic direction of the magnetic field in the free layer 2804, generally indicated at 2814, may be changed using a write current 2812. As shown, the write current represent a write "1" current that flows from the bottom electrode 2810 through the free fixed layer 2808, across the magnetic tunnel junction barrier 2806, through the free layer 2804, and through the top electrode 2802.

FIG. 29 is a cross-sectional view 2900 of the MTJ stack of FIG. 27 taken along line 29-29 in FIG. 27. The MTJ stack includes the first sidewall 2702, the second sidewall 2706 and the bottom wall 2958. In this example, a direction of a first magnetic field carried by the free layer in the first sidewall 2702, as indicated at 2712, extends vertically along the first sidewall 2702 and in a direction corresponding to the arrow 2712. A direction of a second magnetic field carried by the free layer of the second sidewall 2706, as indicated at 2716, extends vertically along the second sidewall 2706 and in a direction corresponding to the arrow 2716.

The MTJ stack includes a first domain barrier (wall) 2954 and a second domain barrier 2950. In a particular example, the second domain barrier 2950 may correspond to a structural interface between the sidewall 2702 and the bottom wall 2958. The second domain barrier 2950 isolates the first magnetic domain 2712 of the free layer of the first sidewall 2702 from the fourth magnetic domain 2720 at the bottom wall 2958. The MTJ stack also includes a third domain barrier 2956 and a fourth domain barrier 2952. The fourth domain barrier 2952 may correspond to a structural interface between the bottom wall 2958 and the sidewall 2706. The fourth domain barrier 2952 isolates the magnetic field 2716 of a free layer of the sidewall 2706 from the magnetic field 2720 of the free layer associated with the bottom wall 2958.

In the embodiment illustrated in FIG. 29, the MTJ stack may be adapted to store at least three data bits that may represent up to eight logical states. A first data bit may be represented by the first magnetic field 2712 carried by a free layer of the first sidewall 2702. A second data bit may be represented by the fourth magnetic field 2720 carried by a free layer of the bottom wall 2958. A third data bit may be represented by the second magnetic field 2716 carried by a free layer of the second sidewall 2706. The write currents 2722, 2726, and 2730 may be applied to selectively alter an orientation of the magnetic field of a selected sidewall without altering the orientation of the magnetic field associated with the other sidewall or of the bottom wall 2958, for example.

FIG. 30 is a cross-sectional view 3000 of the MTJ stack of FIG. 27 taken along line 30-30 in FIG. 27. In this particular example, the MTJ stack includes magnetic domains barriers 3060 and 3062. The magnetic domain barrier (or wall) 3062 isolates the magnetic domain 2718 carried by a free layer of the sidewall 2708 from the magnetic domain 2720 carried by a free layer of the bottom wall 2958.

Figure 31:
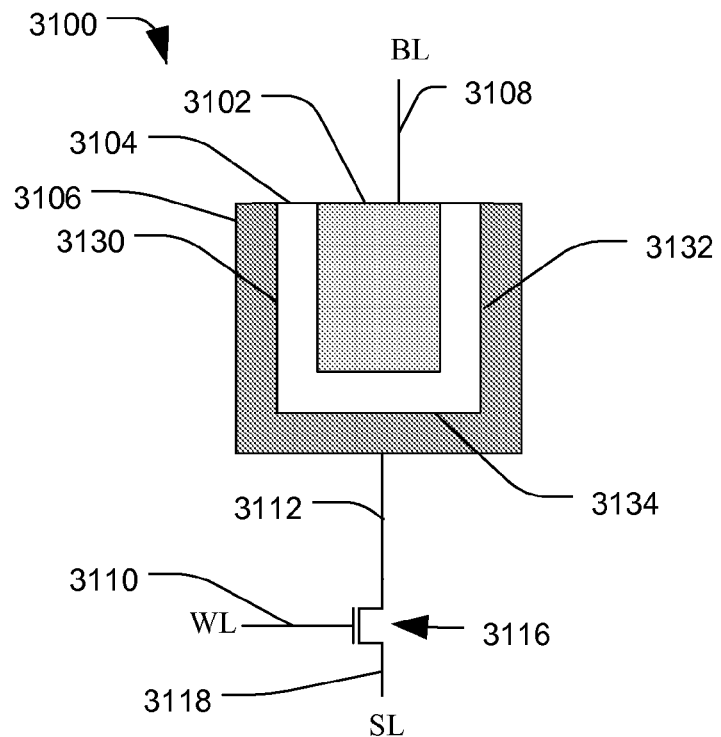
FIG. 31 is a diagram showing a cross-sectional view of a particular illustrative embodiment of a magnetic tunnel junction (MTJ) cell coupled to a bi-directional switch to read data from and to write data to the MTJ cell.

In a particular illustrative embodiment, the domain barriers 2736 and 2738 illustrated in FIG. 27, the domain barriers 2950 and 2952 illustrated in FIG. 29, and the domain barrier 3062 illustrated in FIG. 30 allow the MTJ stack to store multiple digital values. In particular, the MTJ stack illustrated in FIG. 27 may be adapted to store up to four digital values, which may be represented by the magnetic fields 2712, 2716, 2718, and 2720, illustrated in FIGS. 27, 29, and 30. The four digital values may represent up to sixteen logical states FIG. 31 is a diagram showing a cross-sectional view of a particular illustrative embodiment of a MTJ cell coupled to a bi-directional switch to read data from and to write data to the MTJ cell. The MTJ cell 3100 may be utilized in a memory array including bit lines, such as a bit line 3108, and word lines, such as a word line 3110. The MTJ cell 3100 includes a center electrode 3102, a magnetic tunnel junction stack 3104, and a bottom electrode 3106. The MTJ stack 3104 includes a fixed layer, a magnetic tunnel barrier, and a free layer that carries a programmable magnetic domain, which orientation may be altered by applying a write current to the MTJ cell 3100. Additional layers, such as an anti-ferromagnetic layer, may be also included. The MTJ stack 3104 includes at least one vertical sidewall 3130 or 3132 and a horizontal bottom wall 3134. The bit line 3108 is coupled to the center electrode 3102. The word line 3110 is coupled to a control terminal of a switch 3116 that is coupled to the bottom electrode 3106 via a terminal structure, illustrated by a line 3112, that is coupled to the bottom electrode 3106 proximate to the bottom wall 3134. In a particular embodiment, the terminal structure may include a via, a contact, a bond pad, one or more other conductive structures coupled to the MTJ device 3100, or any combination thereof.

In a particular embodiment, the switch 3116 may be a metal oxide semiconductor field effect transistor (MOSFET), a transistor, or other switching circuit component. In another embodiment, the switch 3116 can be a bi-directional switch to allow current flow both into and out of the MTJ cell 3100. The switch 3116 includes a first terminal coupled to the line 3112, a control terminal coupled to the word line 3110, and a second terminal coupled to a source line (SL), which may be coupled to a power source.

In a particular illustrative embodiment, a signal may be applied to the bit line 3108 and to the word line 3110 to activate the switch 3116. After activating the switch 3116, data may be read from the MTJ cell 3100 based on a current flow through the MTJ cell 3100. For example, a fixed voltage may be applied to the bit line 3108 and a voltage may be applied to the word line 3110 to activate the switch 3116. A bit value stored at the free layer of the MTJ stack 3104 may be determined based on a current flow measured either at the bit line 3108 or at the source line 3118, for example. Because the switch 3116 is coupled to the bottom electrode 3106 proximate to the bottom wall 3134, a read current may be primarily determined by current through the bottom wall 3134. In this particular instance, the MTJ cell 3100 may store a single bit value. The MTJ cell 3100 may be a memory cell within a memory array, such as a magneto-resistive random access memory (MRAM), an N-way cache, a non-volatile storage device, other memory devices, or any combination thereof.

Figure 32:
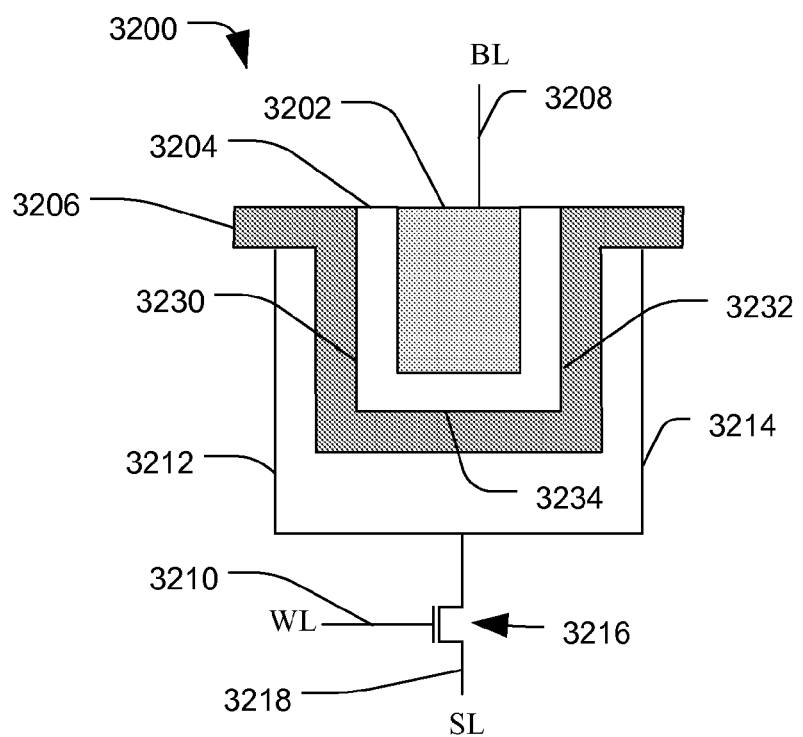
FIG. 32 is a diagram showing a cross-sectional view of a second illustrative embodiment of a MTJ cell coupled to a bi-directional switch to read data from and to write data to the MTJ cell.

FIG. 32 is a diagram showing a cross-sectional view of a second illustrative embodiment of a MTJ cell coupled to a bi-directional switch to read data from and to write data to the MTJ cell. The MTJ cell 3200 may be utilized in a memory array including bit lines, such as a bit line 3208, and word lines, such as a word line 3210. The MTJ cell 3200 includes a center electrode 3202, a magnetic tunnel junction stack 3204, and a bottom electrode 3206. The MTJ stack 3204 includes a fixed layer, a magnetic tunnel barrier, and a free layer that carries a programmable magnetic domain, which orientation may be altered by applying a write current to the MTJ cell 3200. Additional layers may be also included. The MTJ stack 3204 includes at least two vertical sidewalls 3230 and 3232 and a horizontal bottom wall 3234. The bit line 3208 is coupled to the center electrode 3202. The word line 3210 is coupled to a control terminal of a switch 3216 that is coupled to the bottom electrode 3206 via two terminal structures, illustrated by lines 3212 and 3214, that are coupled to the bottom electrode 3206 proximate to the vertical side walls 3230 and 3232. In a particular embodiment, each terminal structure may include a via, a contact, a bond pad, one or more other conductive structures coupled to the MTJ device 3200, or any combination thereof.

In a particular embodiment, the switch 3216 may be a metal oxide semiconductor field effect transistor (MOSFET), a transistor, or other switching circuit component. In another embodiment, the switch 3216 can be a bi-directional switch to allow current flow both into and out of the MTJ cell 3200. The switch 3216 includes a first terminal coupled to the lines 3212 and 3214, a control terminal coupled to the word line 3210, and a second terminal coupled to a source line (SL), which may be coupled to a power source.

In a particular illustrative embodiment, a signal may be applied to the bit line 3208 and to the word line 3210 to activate the switch 3216. After activating the switch 3216, data may be read from the MTJ cell 3200 based on a current flow through the MTJ cell 3200. For example, a fixed voltage may be applied to the bit line 3208 and a voltage may be applied to the word line 3210 to activate the switch 3216. A bit value stored at the free layer of the MTJ stack 3204 may be determined based on a current flow measured either at the bit line 3208 or at the source line, for example. Because the switch 3216 is coupled to the bottom electrode 3206 proximate to the side walls 3230 and 3232, a read current may be primarily determined by current through the side wall 3230 and 3232. In this particular instance, the MTJ cell 3200 may store a single bit value. The MTJ cell 3200 may be a memory cell within a memory array, such as a magneto-resistive random access memory (MRAM), an N-way cache, a non-volatile storage device, other memory devices, or any combination thereof.

Figure 33:
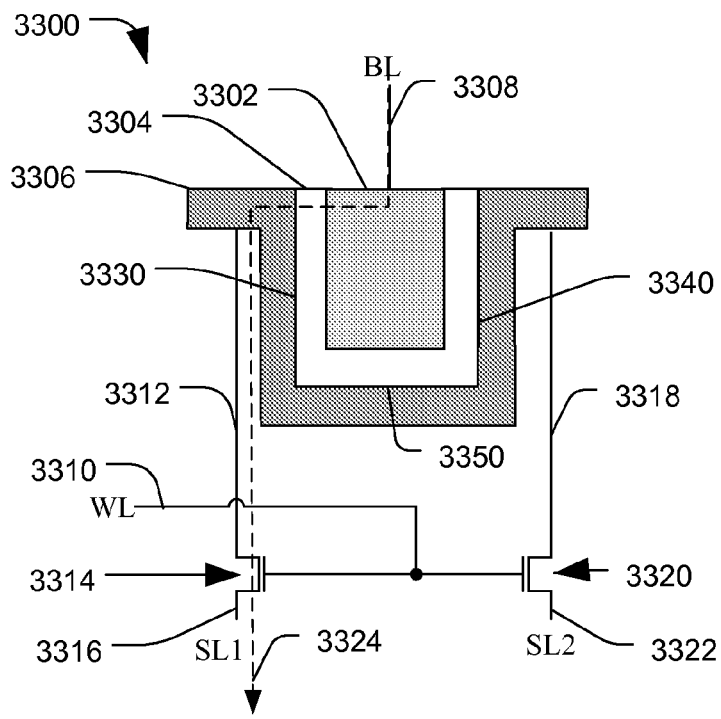
FIG. 33 is a diagram showing a cross-sectional view of a magnetic tunnel junction (MTJ) cell with multiple vertical magnetic domains and coupled to two switches to read data from and to write data to the MTJ cell.

FIG. 33 is a diagram showing a cross-sectional view of a magnetic tunnel junction (MTJ) cell with multiple vertical magnetic domains and coupled to two switches to read data from and to write data to the MTJ cell. The MTJ cell 3300 includes a center electrode 3302, an MTJ structure 3304, and a bottom electrode 3306. The MTJ structure 3304 includes a fixed magnetic layer, a magnetic tunnel junction barrier layer, and a free magnetic layer. Additional layers may be also included. The free magnetic layer carries a magnetic field that can be changed using a write current to store a data value. The MTJ cell 3300 may be a memory cell within a memory array, such as a magneto-resistive random access memory (MRAM), an N-way cache, a non-volatile storage device, other memory devices, or any combination thereof.

A bit line 3308 may be coupled to the center electrode 3302. A word line 3310 may be coupled to control terminals of a first transistor 3314 and of a second transistor 3320. The first transistor 3314 includes a first terminal coupled to the bottom electrode 3306 via a first terminal structure depicted as a line 3312 and a second terminal 3316 coupled to a first source line (SL1), which may be coupled to a first power source. The second transistor 3320 includes a first terminal coupled to the bottom electrode 3306 via a second terminal structure depicted as a line 3318 and includes a second terminal 3322 coupled to a second source line (SL2), which may be coupled to a second power source.

In a particular example, the transistor 3314 may be activated by the word line 3310 to provide a current path 3324 from the bit line 3308 through the center electrode 3302, the MTJ structure 3304, the bottom electrode 3306, the line 3312 and the transistor 3314 to the second terminal 3316. Current flow via the current path 3324 indicates a "1" value or a "0" value stored at a magnetic domain associated with a side wall 3330. Similarly, a current path provided via the line 3318 through the transistor 3320 may be used to access data stored via a magnetic domain adjacent to a sidewall 3340 of the MTJ cell 3300.

In general, to utilize multiple magnetic domains to store multiple data values in a single MTJ cell, such as the MTJ cell 3300, switches, such as the switches 3314 and 3320, may be utilized to access the unique magnetic domains associated with the vertical sidewalls 3330 and 3340 and the horizontal bottom wall 3350. An advantage of the MTJ cell 3300 is that multiple vertical magnetic domains may be formed to allow multiple digital values to be stored within a single cell, thereby increasing storage density. Each of the multiple vertical magnetic domains includes a respective magnetic field orientation (direction) that can be modified by altering a current direction into or out of the MTJ cell 3300. In a particular example, each of the magnetic fields of the MTJ cell 3300 may be changed independently, without changing a magnetic orientation of other magnetic domains.

In a particular embodiment, because the source line 3316 and the source line 3322 are separated, it is possible to program the sidewall 3330 without changing the magnetic field of the sidewall 3340. The bit line 3308 and the word line 3310 may be utilized in conjunction with the source lines 3316 and 3320 to separately change a direction of one or both of the magnetic domains at the sidewalls 3330 and 3340 to store independent bit values.

Figure 34:
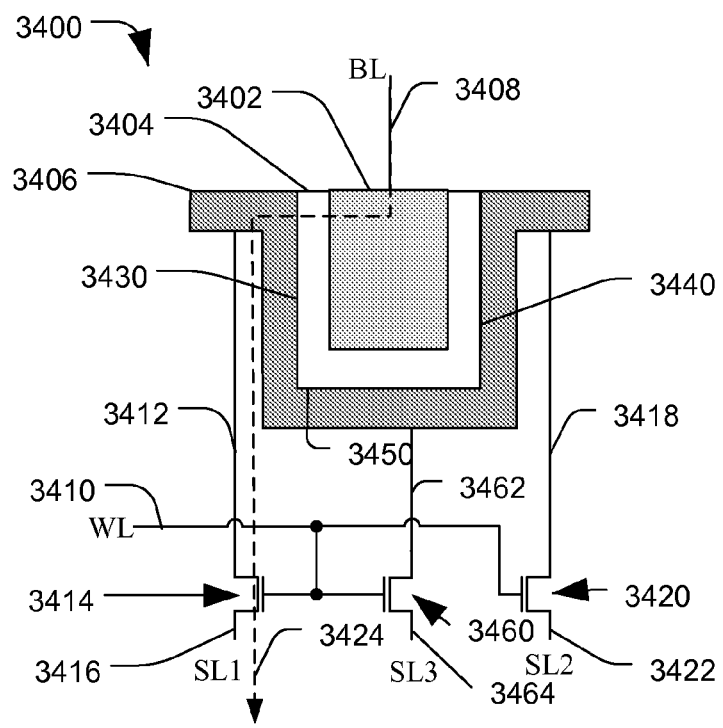
FIG. 34 is a diagram showing a cross-sectional view of a particular illustrative embodiment of a magnetic tunnel junction (MTJ) cell with multiple vertical magnetic domains and coupled to three switches to read data from and to write data to the MTJ cell.

FIG. 34 is a diagram showing a cross-sectional view of an MTJ cell with multiple vertical magnetic domains and coupled to three switches to read data from and to write data to the MTJ cell. The MTJ cell 3400 includes a center electrode 3402, an MTJ structure 3404, and a bottom electrode 3406. The MTJ structure 3404 includes a fixed magnetic layer, a magnetic tunnel junction barrier layer, and a free magnetic layer. The free magnetic layer carries a magnetic field that can be changed using a write current to store a data value. The MTJ cell 3400 may be a memory cell within a memory array, such as a magneto-resistive random access memory (MRAM), an N-way cache, a non-volatile storage device, other memory devices, or any combination thereof.

A bit line 3408 may be coupled to the center electrode 3402. A word line 3410 may be coupled to control terminals of a first transistor 3414, a second transistor 3420, and a third transistor 3460. The first transistor 3414 includes a first terminal coupled to the bottom electrode 3406 via a first terminal structure depicted as a line 3412 and a second terminal 3416 coupled to a first source line (SL1), which may be coupled to a first power source. The second transistor 3420 includes a first terminal coupled to the bottom electrode 3406 via a second terminal structure depicted as a line 3418 and includes a second terminal 3422 coupled to a second source line (SL2), which may be coupled to a second power source. The third transistor 3460 includes a first terminal coupled to the bottom electrode 3406 via a third terminal structure depicted as a line 3462 and includes a second terminal 3464 coupled to a third source line (SL3), which may be coupled to a third power source.

In a particular example, the transistor 3414 may be activated by the word line 3410 to provide a current path 3424 from the bit line 3408 through the center electrode 3402, the MTJ structure 3404, the bottom electrode 3406, the line 3412 and the transistor 3414 to the second terminal 3416. Current flow via the current path 3424 indicates a "1" value or a "0" value stored at a vertical magnetic domain associated with the side wall 3430. Similarly, a current path provided via the line 3418 through the transistor 3420 may be used to access data stored via a vertical magnetic domain adjacent to the side wall 3440 of the MTJ cell 3400. Likewise, the current path provided via the line 3462 through the transistor 3460 may be used to access data stored via a horizontal magnetic domain adjacent to the bottom wall 3450.

In general, to use multiple magnetic domains to store multiple data values in a single MTJ cell, such as the MTJ cell 3400, switches, such as the switches 3414, 3420, and 3460 may be used to access the unique magnetic domains associated with the vertical sidewalls 3430 and 3440 and the horizontal bottom wall 3450. An advantage of the MTJ cell 3400 is that multiple vertical magnetic domains may be formed to allow multiple bits to be stored within a single cell, thereby increasing storage density. Each of the multiple vertical magnetic domains includes a respective magnetic field orientation (direction) that can be modified by altering a current direction into or out of the MTJ cell 3400. In a particular example, each of the magnetic fields of the MTJ cell 3400 may be changed independently, without changing a magnetic orientation of other magnetic domains.

Figure 35:
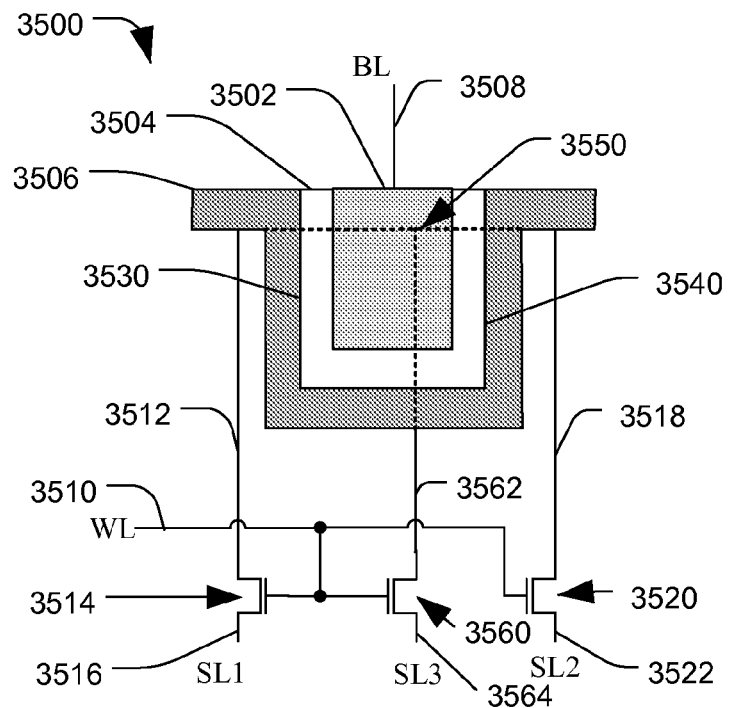
FIG. 35 is a diagram showing a cross-sectional view of a second illustrative embodiment of a magnetic tunnel junction (MTJ) cell with multiple vertical magnetic domains and coupled to three switches to read data from and to write data to the MTJ cell.

FIG. 35 is a diagram showing a cross-sectional view of a second illustrative embodiment of a magnetic tunnel junction (MTJ) cell with multiple vertical magnetic domains and coupled to three switches to read data from and to write data to the MTJ cell. The MTJ cell 3500 includes a center electrode 3502, an MTJ structure 3504, and a bottom electrode 3506. The MTJ structure 3504 includes a fixed magnetic layer, a magnetic tunnel junction barrier layer, and a free magnetic layer. The free magnetic layer carries a magnetic field that can be changed using a write current to store a data value. The MTJ cell 3500 may be a memory cell within a memory array, such as a magneto-resistive random access memory (MRAM), an N-way cache, a non-volatile storage device, other memory devices, or any combination thereof.

A bit line 3508 may be coupled to the center electrode 3502. A word line 3510 may be coupled to control terminals of a first transistor 3514, a second transistor 3520, and a third transistor 3560. The first transistor 3514 includes a first terminal coupled to the bottom electrode 3506 via a first terminal structure that is proximate to a first sidewall 3530 and depicted as a line 3512. The first transistor 3514 includes a second terminal 3516 coupled to a first source line (SL1), which may be coupled to a first power source. The second transistor 3520 includes a first terminal coupled to the bottom electrode 3506 via a second terminal structure that is proximate to a second sidewall 3540 and depicted as a line 3518. The second transistor 3520 includes a second terminal 3522 coupled to a second source line (SL2), which may be coupled to a second power source. The third transistor 3560 includes a first terminal coupled to the bottom electrode 3506 via a third terminal structure that is proximate to a third sidewall 3550 (located behind the center electrode 3502 and indicated as a broken line) and depicted as a line 3562. The third transistor 3560 includes a second terminal 3564 coupled to a third source line (SL3), which may be coupled to a third power source.

In a particular example, the transistor 3514 may be activated by the word line 3510 to provide a current path from the bit line 3508 through the center electrode 3502, the MTJ structure 3504, the bottom electrode 3506, the line 3512 and the transistor 3514 to the second terminal 3516. Current flow through the transistor 3514 may indicate a "1" value or a "0" value stored at a vertical magnetic domain associated with the side wall 3530. Similarly, a current path provided via the line 3518 through the transistor 3520 may be used to access data stored via a vertical magnetic domain adjacent to the side wall 3540 of the MTJ cell 3500. Likewise, the current path provided via the line 3562 through the transistor 3560 may be used to access data stored via a vertical magnetic domain adjacent to the third sidewall 3550.

In general, to use multiple magnetic domains to store multiple data values in a single MTJ cell, such as the MTJ cell 3500, switches, such as the switches 3514, 3520, and 3560 may be used to access the unique magnetic domains associated with the vertical sidewalls 3530, 3540, and 3550. An advantage of the MTJ cell 3500 is that multiple vertical magnetic domains may be formed to allow multiple bits to be stored within a single cell, thereby increasing storage density. Each of the multiple vertical magnetic domains includes a respective magnetic field orientation (direction) that can be modified by altering a current direction into or out of the MTJ cell 3500. In a particular example, each of the magnetic fields of the MTJ cell 3500 may be changed independently, without changing a magnetic orientation of other magnetic domains.

Figure 36:
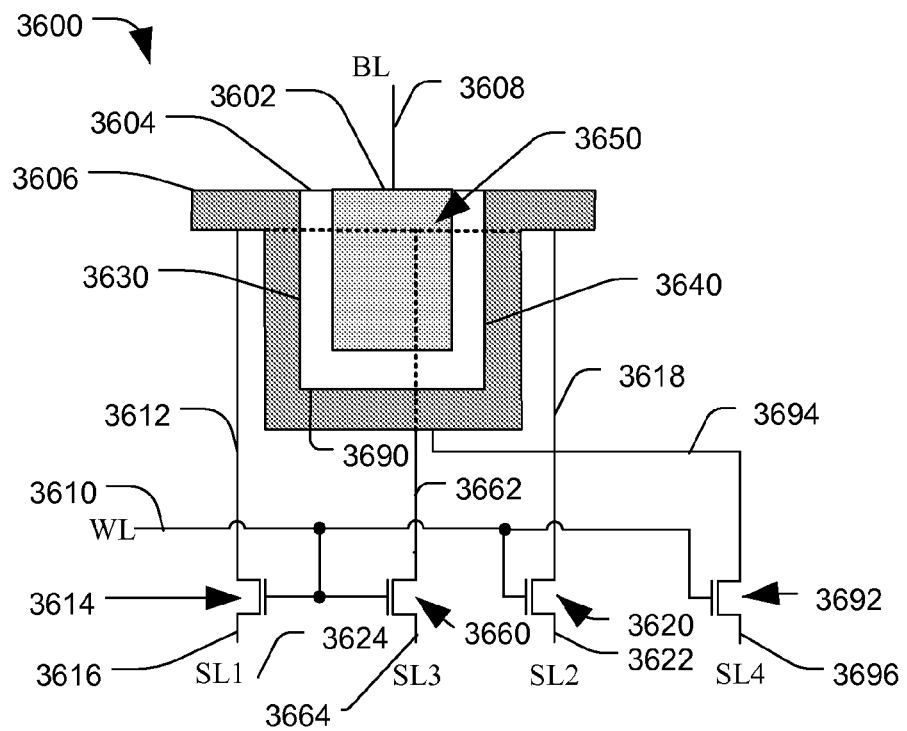
FIG. 36 is a diagram showing a cross-sectional view of a magnetic tunnel junction (MTJ) cell with multiple vertical magnetic domains and coupled to four switches to read data from and to write data to the MTJ cell.

FIG. 36 is a diagram showing a cross-sectional view of a magnetic tunnel junction (MTJ) cell with multiple vertical magnetic domains and coupled to four switches to read data from and to write data to the MTJ cell. The MTJ cell 3600 includes a center electrode 3602, an MTJ structure 3604, and a bottom electrode 3606. The MTJ structure 3604 includes a fixed magnetic layer, a magnetic tunnel junction barrier layer, and a free magnetic layer. The MTJ structure 3604 may also include an anti-ferromagnetic (AF) layer, other additional layers, or any combination thereof. The free magnetic layer carries a magnetic field that can be changed using a write current to store a data value. The MTJ cell 3600 may be a memory cell within a memory array, such as a magneto-resistive random access memory (MRAM), an N-way cache, a non-volatile storage device, other memory devices, or any combination thereof.

A bit line 3608 may be coupled to the center electrode 3602. A word line 3610 may be coupled to control terminals of a first transistor 3614, a second transistor 3620, a third transistor 3660, and a fourth transistor 3692. The first transistor 3614 includes a first terminal coupled to the bottom electrode 3606 via a first terminal structure that is proximate to a first sidewall 3630 and depicted as a line 3612. The first transistor 3614 includes a second terminal 3616 coupled to a first source line (SL1), which may be coupled to a first power source. The second transistor 3620 includes a first terminal coupled to the bottom electrode 3606 via a second terminal structure that is proximate to a second sidewall 3640 and depicted as a line 3618. The second transistor 3620 includes a second terminal 3622 coupled to a second source line (SL2), which may be coupled to a second power source. The third transistor 3660 includes a first terminal coupled to the bottom electrode 3606 via a third terminal structure that is proximate to a third sidewall 3650 (located behind the center electrode 3602 and indicated as a broken line) and depicted as a line 3662. The third transistor 3660 includes a second terminal 3664 coupled to a third source line (SL3), which may be coupled to a third power source. The fourth transistor 3692 includes a first terminal coupled to the bottom electrode 3606 via a fourth terminal structure that is proximate to a bottom wall 3690 and depicted as a line 3694. The fourth transistor 3692 includes a second terminal 3696 coupled to a fourth source line (SL4), which may be coupled to a fourth power source.

In a particular example, the transistor 3614 may be activated by the word line 3610 to provide a current path from the bit line 3608 through the center electrode 3602, the MTJ structure 3604, the bottom electrode 3606, the line 3612 and the transistor 3614 to the second terminal 3616. Current flow through the transistor 3614 may indicate a "1" value or a "0" value stored at a vertical magnetic domain associated with the side wall 3630. Similarly, a current path provided via the line 3618 through the transistor 3620 may be used to access data stored via a vertical magnetic domain adjacent to the side wall 3640 of the MTJ cell 3600. Likewise, the current path provided via the line 3662 through the transistor 3660 may be used to access data stored via a vertical magnetic domain adjacent to the third sidewall 3650. In addition, the current path provided via the line 3694 through the transistor 3692 may be used to access data stored via the horizontal magnetic domain adjacent to the bottom wall 3690.

In general, to use multiple magnetic domains to store multiple data values in a single MTJ cell, such as the MTJ cell 3600, switches, such as the switches 3614, 3620, 3660, and 3692 may be used to access the unique magnetic domains associated with the vertical sidewalls 3630, 3640, and 3650 and the horizontal bottom wall 3690. An advantage of the MTJ cell 3600 is that multiple vertical magnetic domains may be formed to allow multiple bits to be stored within a single cell, thereby increasing storage density. Each of the multiple vertical magnetic domains and the horizontal magnetic domain includes a respective magnetic field orientation (direction) that can be modified by altering a current direction into or out of the MTJ cell 3600. In a particular example, each of the magnetic fields of the MTJ cell 3600 may be changed independently, without changing a magnetic orientation of other magnetic domains.

Figure 37:
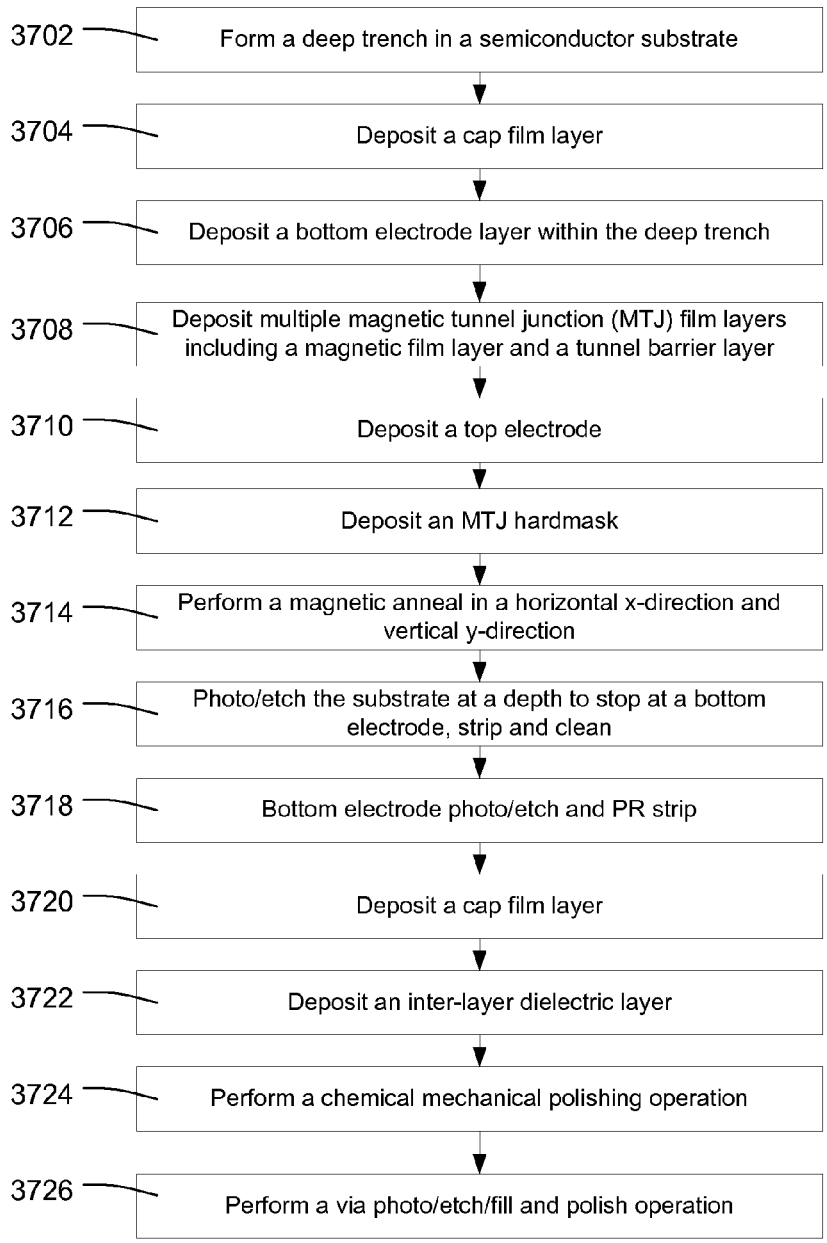
FIG. 37 is a flow diagram of a particular illustrative embodiment of a method of fabricating a magnetic tunnel junction (MTJ) device with multiple vertical magnetic domains.

FIG. 37 is a flow diagram of a particular illustrative embodiment of a method of fabricating a magnetic tunnel junction (MTJ) device with multiple vertical magnetic domains. In a particular embodiment, the method may be used during fabrication of MTJ devices such as illustrated in FIG. 4 or FIG. 5. In general, a depth of a trench for formation of the MTJ structure is tightly controlled. The MTJ film deposit is made and the top electrode thickness is controlled to form narrow turn gaps without seams. The magnetic anneal process is applied in two dimensions along a horizontal dimension and a vertical direction to initialize the bottom and the vertical magnetic domains with a fixed magnetic field direction. By controlling the shape of the cell and the depth of the cell, such that the depth is greater than the width and the length, a direction of the magnetic fields within the MTJ cell may be controlled. In a particular example, a large aspect ratio of the depth to width and length can make the bottom MTJ and the sidewall MTJ magnetic domains more isotropic. In a particular embodiment, a MTJ stack structure is defined by a deep trench, and MTJ photo and etch processes that may be critical or expensive may be avoided. The trench photo and etch process may be more easily controlled than a MTJ photo and etch process, resulting in lower costs and improved performance.

At 3702, a deep trench is formed in a semiconductor substrate. In a particular embodiment, the trench depth is greater than the trench length and width so that the MTJ device will have at least one vertical magnetic domain. Moving to 3704, a cap film layer is deposited. Continuing to 3706, a bottom electrode is deposited within the deep trench. Advancing to 3708, multiple magnetic tunnel junction (MTJ) film layers are deposited, including a magnetic film layer and a tunnel barrier layer.

Proceeding to 3710, a top electrode is deposited. Moving to 3712, a MTJ hardmask is deposited. Continuing to 3714, a magnetic anneal is performed in a horizontal X direction and in a vertical Y direction. Advancing to 3716, the substrate is patterned and etched at a depth to stop at the bottom electrode and a photoresist (PR) strip and clean process is performed. Proceeding to 3718, a bottom electrode photo/etch process is performed with a PR strip process is performed. Moving to 3720, a cap film layer is deposited.

Continuing to 3722, an inter-layer dielectric layer is deposited. Proceeding to 3724, a chemical mechanical polishing (CMP) operation is performed. Moving to 3726, a via photo/etch/fill and polish operation is performed.

Figure 38:
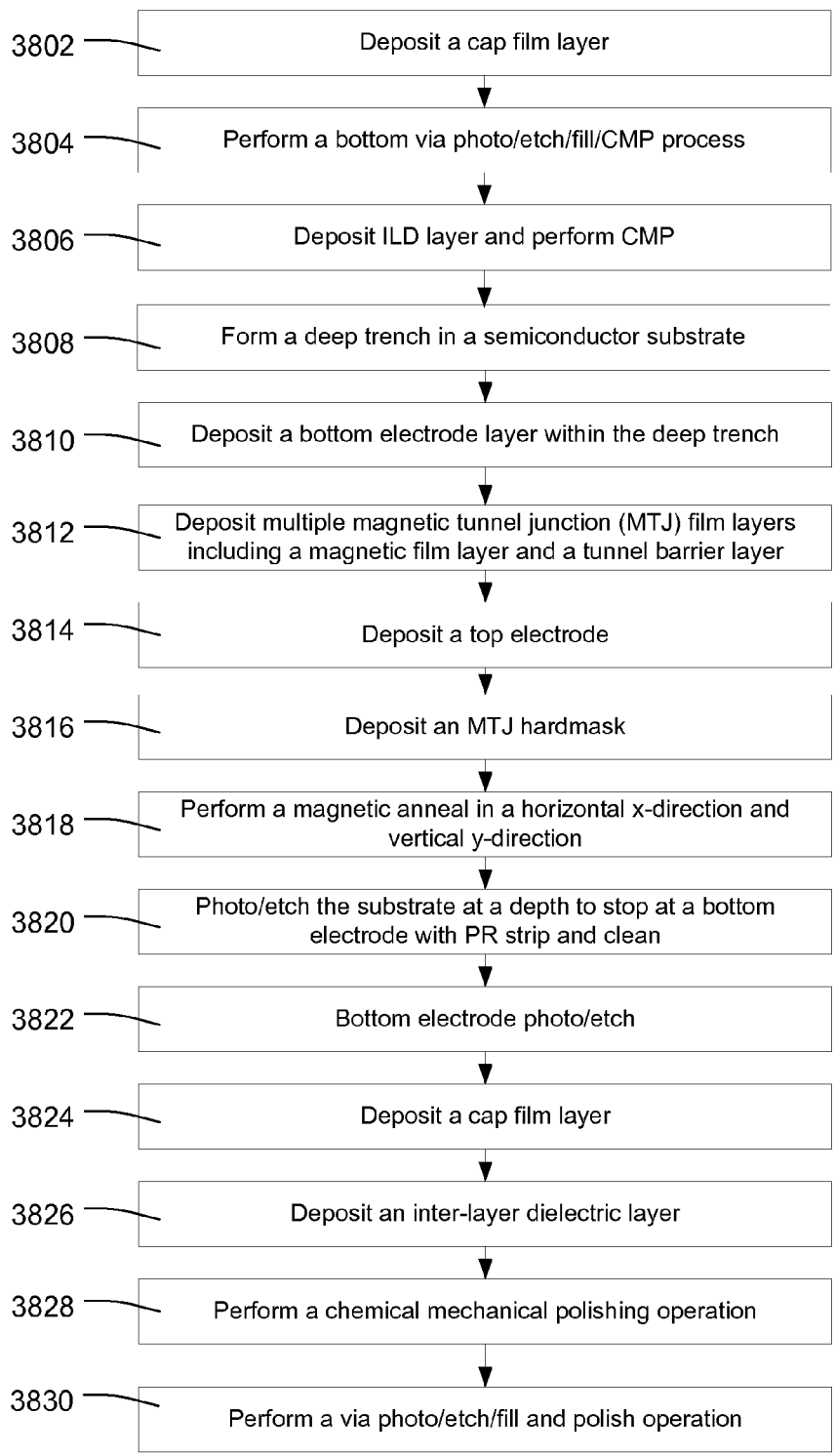
FIG. 38 is a flow diagram of a second particular illustrative embodiment of a method of fabricating a magnetic tunnel junction (MTJ) device with multiple vertical magnetic domains.

FIG. 38 is a flow diagram of a second particular illustrative embodiment of a method of fabricating a magnetic tunnel junction (MTJ) device with multiple vertical magnetic domains. In a particular embodiment, the method may be used during fabrication of MTJ devices such as illustrated in FIG. 6.

At 3802, a cap film layer is deposited. Moving to 3804, a bottom via photo/etch/fill and chemical mechanical polishing (CMP) process is performed. Continuing to 3806, an inter-layer dielectric (ILD) layer is deposited and a CMP process is performed.

At 3808, a deep trench is formed in a semiconductor substrate. In a particular embodiment, the trench depth is greater than the trench length and width so that the MTJ device will have at least one vertical magnetic domain. Continuing to 3810, a bottom electrode is deposited within the deep trench. Advancing to 3812, multiple magnetic tunnel junction (MTJ) film layers are deposited, including a magnetic film layer and a tunnel barrier layer.

Proceeding to 3814, a top electrode is deposited. Moving to 3816, an MTJ hardmask is deposited. Continuing to 3818, a magnetic anneal is performed in a horizontal X direction and in a vertical Y direction. Advancing to 3820, the substrate is patterned and etched at a depth to stop at the bottom electrode. Proceeding to 3822, a bottom electrode photo/etch process is performed. In a particular embodiment, such as during fabrication of the MTJ device illustrated in FIG. 31, the photo and etch process for the MTJ device and the bottom electrode may be combined.

Moving to 3824, a cap film layer is deposited. Advancing to 3826, an inter-layer dielectric layer is deposited. Proceeding to 3828, a chemical mechanical polishing (CMP) operation is performed. Moving to 3830, a via photo/etch/fill and polish operation is performed.

Figure 39:
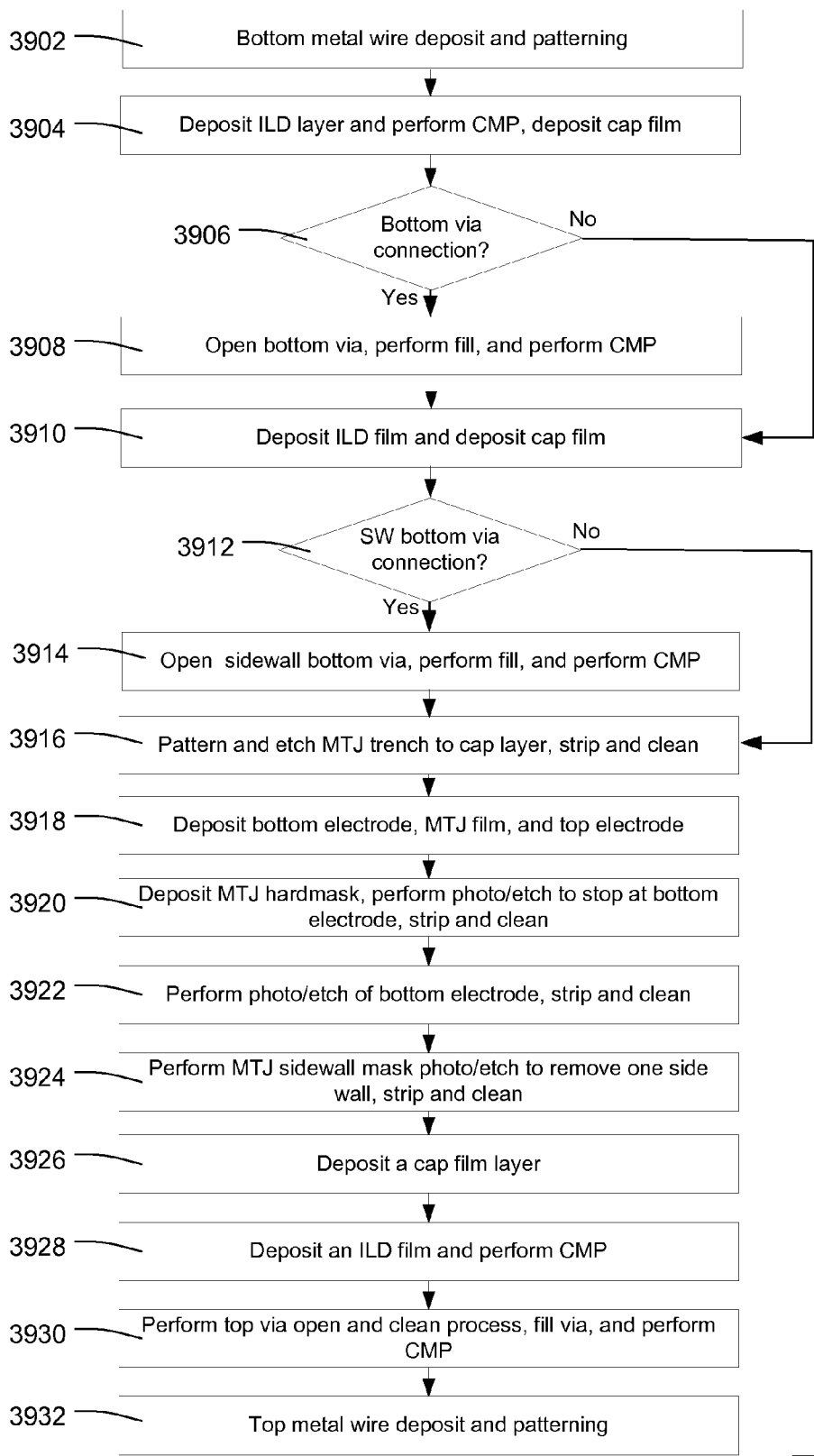
FIG. 39 is a flow diagram of a third particular illustrative embodiment of a method of fabricating a magnetic tunnel junction (MTJ) device with multiple vertical magnetic domains.

FIG. 39 is a flow diagram of a third particular illustrative embodiment of a method of fabricating a magnetic tunnel junction (MTJ) device with multiple vertical magnetic domains. In a particular embodiment, the method may be used during fabrication of MTJ devices such as illustrated in FIGS. 15-22.

At 3902, bottom metal wire is deposited and patterning is performed. If a Damascene process is used, a bottom metal and a via process may be combined. Moving to 3904, an inter-layer dielectric (IDL) layer is deposited, a chemical mechanical polishing (CMP) is performed, and a cap film is deposited. Proceeding to 3906, a determination is made whether the MTJ device includes a bottom via connection, such as depicted in FIGS. 19-22. Continuing to 3908, when the MTJ device includes a bottom via connection, the bottom via is opened, filled, and a via CMP is performed. When the MTJ device does not include a bottom via connection, the method proceeds to 3910, where an inter-layer dielectric film is deposited and a cap film are deposited. Proceeding to 3912, a determination is made whether the MTJ device includes a sidewall bottom via connection, such as depicted in FIGS. 17-18. Continuing to 3914, when the MTJ device includes a sidewall bottom via connection, the sidewall bottom via is opened, filled, and a via CMP is performed. When the MTJ device does not include a sidewall bottom via connection, the method proceeds to 3916.

Moving to 3916, the MTJ trench is patterned and etched to the cap layer, stripped, and cleaned. Continuing to 3918, a bottom electrode is deposited, the MTJ film is deposited, and a top electrode is deposited. Advancing to 3920, a MTJ hardmask is deposited, a photo/etch process is performed to stop at the bottom electrode, photo resist stripped, and cleaned. Proceeding to 3922, a photo/etch process of the bottom electrode is performed with photo resist strip and clean.

Moving to 3924, a MTJ sidewall mask photo/etch process is performed to remove one side wall, photo resist stripped, and cleaned. Continuing to 3926, a cap film layer is deposited. Advancing to 3928, an inter-layer dielectric film is deposited and a CMP performed. Proceeding to 3930, a top via open/etch and clean process is performed, the via is filled, and a via CMP is performed. Moving to 3932, top metal wire is deposited and patterned. If damascene process is existed, the via process of 3930 via and the metal process of 3932 can be combined.

Figure 40:
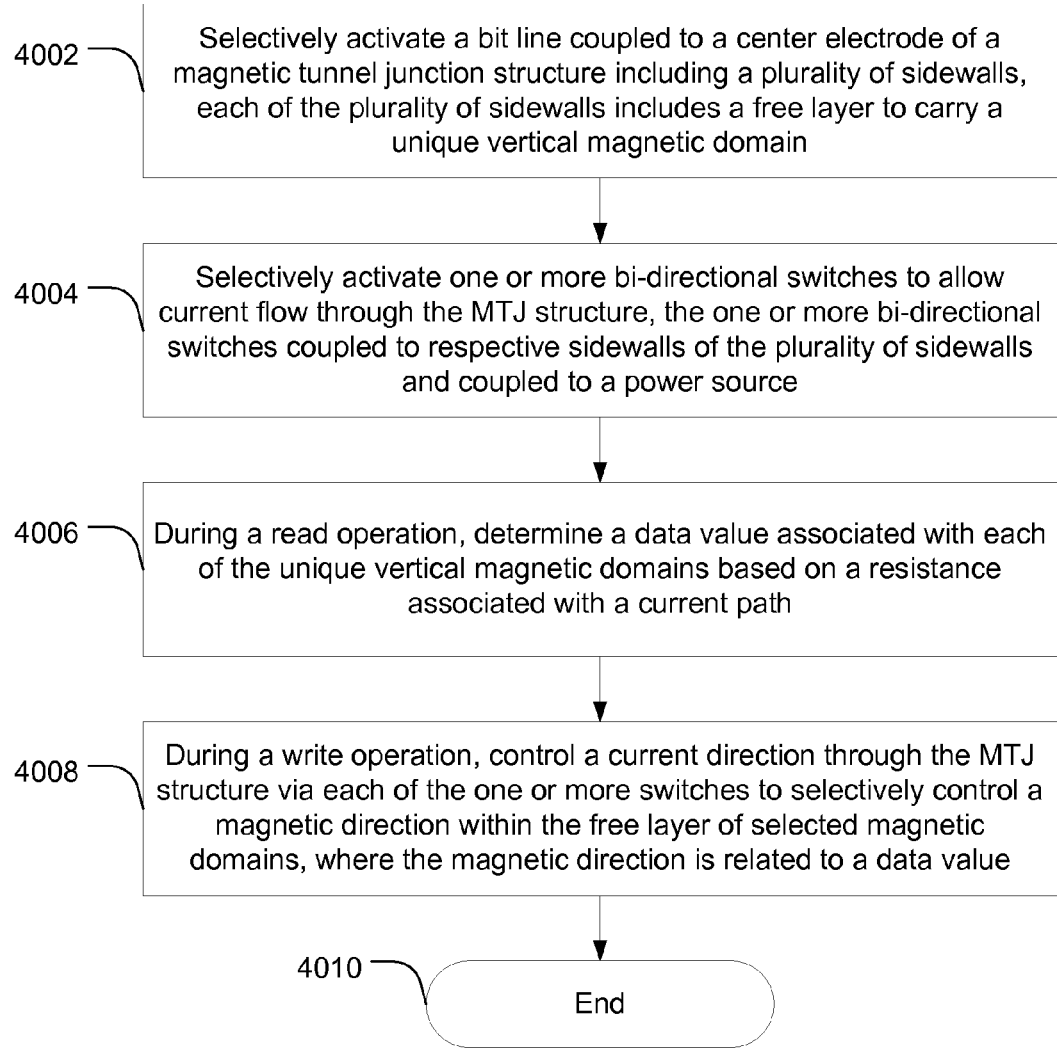
FIG. 40 is a flow diagram of a particular illustrative embodiment of a method of operating a magnetic tunnel junction (MTJ) device with multiple vertical magnetic domains.

FIG. 40 is a flow diagram of a particular illustrative embodiment of a method of operating an MTJ device with multiple vertical magnetic domains. At 4002, the method includes selectively activating a bit line coupled to a center electrode of a magnetic tunnel junction structure including a plurality of sidewalls, where each of the plurality of sidewalls includes a free layer to carry a unique vertical magnetic domain. Continuing to 4004 one or more bi-directional switches are selectively activated to allow current flow through the MTJ structure, where the one or more bi-directional switches are coupled to respective sidewalls of a plurality of sidewalls and coupled to a power source. Moving to 4006, during a read operation, a data value associated with each of the unique vertical magnetic domains is determined based on a resistance associated with the current path. Proceeding to 4008, during a write operation, a current direction through the MTJ structure is controlled via each of the one or more switches to selectively control a magnetic correction within the free layer of selective magnetic domains, where the magnetic direction is related to a data value. The method terminates at 4010.

Figure 41:
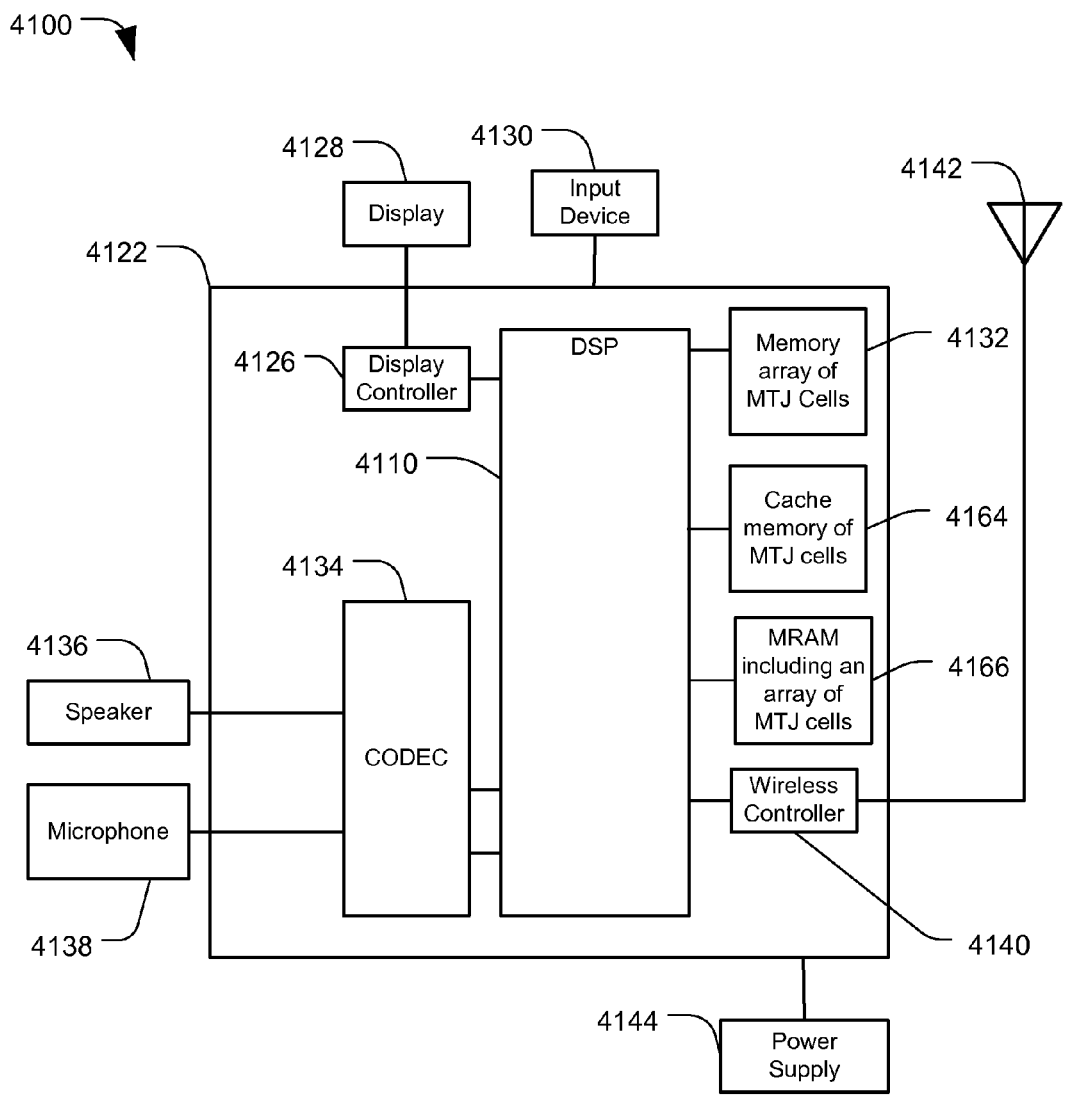
FIG. 41 is a block diagram of a communications device including a memory device including magnetic tunnel junction (MTJ) cells.

FIG. 41 is a block diagram of a communications device 4100 including a memory device including multiple magnetic tunnel junction (MTJ) cells. The communications device 4100 includes a memory array of MTJ cells 4132 and a cache memory of MTJ cells 4164, which are coupled to a processor, such as a digital signal processor (DSP) 4110. The communications device 4100 also includes a magneto-resistive random access memory (MRAM) device 4166 that is coupled to the DSP 4110. In a particular example, the memory array of MTJ cells 4132, the cache memory of MTJ cells 4164, and the MRAM device 4166 include multiple MTJ cells, where each MTJ cell includes at least one vertical domain and is adapted to store multiple independent digital values, as described with respect to FIGS. 1-21.

FIG. 41 also shows a display controller 4126 that is coupled to the digital signal processor 4110 and to a display 4128. A coder/decoder (CODEC) 4134 can also be coupled to the digital signal processor 4110. A speaker 4136 and a microphone 4138 can be coupled to the CODEC 4134.

FIG. 41 also indicates that a wireless controller 4140 can be coupled to the digital signal processor 4110 and to a wireless antenna 4142. In a particular embodiment, an input device 4130 and a power supply 4144 are coupled to the on-chip system 4122. Moreover, in a particular embodiment, as illustrated in FIG. 41, the display 4128, the input device 4130, the speaker 4136, the microphone 4138, the wireless antenna 4142, and the power supply 4144 are external to the on-chip system 4122. However, each can be coupled to a component of the on-chip system 4122, such as an interface or a controller.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, MRAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A magnetic tunnel junction (MTJ) cell comprising:
   a side wall defining a first magnetic domain adapted to store a first digital value; and
   a bottom wall coupled to the side wall and defining a second magnetic domain adapted to store a second digital value.

2. The MTJ cell of claim 1, further comprising a second side wall defining a third magnetic domain adapted to store a third digital value.

3. The MTJ cell of claim 2, wherein the side wall is substantially parallel to the second side wall.

4. The MTJ cell of claim 3, wherein side wall is separated from the second side wall by a distance that is less than a height of the side wall.

5. The MTJ cell of claim 2, wherein the side wall is substantially perpendicular to the second side wall.

6. The MTJ cell of claim 2, further comprising a third side wall defining a fourth magnetic domain adapted to store a fourth digital value.

7. The MTJ cell of claim 6, further comprising a fourth side wall defining a fifth magnetic domain adapted to store a fifth digital value.

8. The MTJ cell of claim 7, wherein the MTJ cell is U-shaped.

9. The MTJ cell of claim 1, wherein the side wall has a rectangular shape.

10. A memory device comprising:
    a magnetic tunnel junction (MTJ) cell comprising:
       a side wall defining a first magnetic domain adapted to store a first digital value; and
       a bottom wall coupled to the side wall and defining a second magnetic domain adapted to store a second digital value.

11. The memory device of claim 10, further comprising:
    a first terminal coupled to the MTJ cell; and
    a first transistor coupled to the first terminal and coupled to a data write line and to a first source line.

12. The memory device of claim 11, further comprising:
    a second terminal coupled to the MTJ cell; and
    a second transistor coupled to the second terminal and coupled to the data write line and to a second source line.

13. The memory device of claim 12, wherein the first terminal is coupled to the side wall and wherein the second terminal is coupled to the bottom wall.

14. The memory device of claim 12, further comprising a third terminal coupled to the MTJ cell and to a bit line.

15. The memory device of claim 10, wherein the MTJ cell further comprises a second side wall substantially parallel to the side wall and defining a third magnetic domain adapted to store a third value.

16. The memory device of claim 15, further comprising a center electrode extending between the side wall and the second side wall.

17. The memory device of claim 15, further comprising a third side wall defining a fourth magnetic domain adapted to store a fourth digital value.

18. The memory device of claim 17, further comprising a fourth side wall and defining a fifth magnetic domain adapted to store a fifth digital value.

19. The memory device of claim 18, wherein the fourth side wall is substantially parallel to the third side wall.

20. A method comprising:
    selectively activating a bit line coupled to a center electrode of a magnetic tunnel junction (MTJ) structure including a plurality of side walls, each of the plurality of sidewalls including a free layer to carry a unique vertical magnetic domain; and
    selectively activating one or more bidirectional switches to enable current to flow through the MTJ structure, wherein each of the one or more bi-directional switches is coupled to a respective side wall of the plurality of side walls and to a power source.

21. The method of claim 20, further comprising, during a read operation, determining a data value associated with each of the unique vertical magnetic domains based on a resistance associated with a current path through the MTJ structure.

22. The method of claim 20, further comprising, during a write operation, selectively controlling magnetic directions within free layers of selected magnetic domains, the magnetic directions associated with data values.

* * * * *